(12) United States Patent
Sharma et al.

(10) Patent No.: US 7,687,277 B2
(45) Date of Patent: Mar. 30, 2010

(54) THERMALLY CONTROLLED FLUIDIC SELF-ASSEMBLY

(75) Inventors: Ravi Sharma, Fairport, NY (US); Charles P. Lusignan, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 1497 days.

(21) Appl. No.: 11/021,120

(22) Filed: Dec. 22, 2004

(65) Prior Publication Data

US 2006/0134799 A1 Jun. 22, 2006

(51) Int. Cl.
*G01N 33/00* (2006.01)

(52) U.S. Cl. ....................................................... 436/174
(58) Field of Classification Search .................. 436/174
See application file for complete search history.

(56) References Cited

U.S. PATENT DOCUMENTS

| | | | |
|---|---|---|---|
| 5,545,291 | A | 8/1996 | Smith et al. |
| 5,783,856 | A | 7/1998 | Smith et al. |
| 5,824,186 | A | 10/1998 | Smith et al. |
| 5,904,545 | A | 5/1999 | Smith et al. |
| 5,955,515 | A | 9/1999 | Kimura et al. |
| 6,248,529 | B1 | 6/2001 | Connolly |
| 6,274,508 | B1 | 8/2001 | Jacobsen et al. |
| 6,417,025 | B1 | 7/2002 | Gengel |
| 6,420,266 | B1 | 7/2002 | Smith et al. |
| 6,468,638 | B2 | 10/2002 | Jacobsen et al. |
| 6,479,395 | B1 | 11/2002 | Smith et al. |
| 6,527,964 | B1 | 3/2003 | Smith et al. |
| 6,536,106 | B1 | 3/2003 | Jackson et al. |
| 6,555,408 | B1 | 4/2003 | Jacobsen et al. |
| 6,586,338 | B2 | 7/2003 | Smith et al. |
| 6,605,453 | B2 | 8/2003 | Ozkan et al. |
| 6,611,237 | B2 | 8/2003 | Smith |
| 6,623,579 | B1 | 9/2003 | Smith et al. |
| 2002/0005294 | A1 | 1/2002 | Mayer et al. |
| 2002/0031813 | A1 | 3/2002 | Ozkan et al. |
| 2002/0093396 | A1 | 7/2002 | Smith |
| 2002/0124797 | A1 | 9/2002 | Kitano et al. |
| 2002/0149107 | A1 | 10/2002 | Chang et al. |

(Continued)

FOREIGN PATENT DOCUMENTS

EP 1 120 155 8/2001

(Continued)

OTHER PUBLICATIONS

Joseph Tien et al., "Crystallization of Millimeter-Scale Objects with Use of Capillary Forces", Journal of the American Chemical Society, 1998, vol. 120, pp. 12670-12671.

(Continued)

*Primary Examiner*—Sam P Siefke
(74) *Attorney, Agent, or Firm*—Roland R. Schindler

(57) ABSTRACT

Methods and apparatuses are provided for assembling a structure on a support having a pattern of binding sites. In accordance with the method, a first fluid is provided on the surface of the support with the first fluid being of a type that that increases viscosity when cooled, the first fluid having first micro-components suspended therein each adapted to engage the binding sites. First fluid proximate to selected binding sites is cooled to increase the viscosity of the responsive fluid proximate to the selected binding sites so that the first micro-components suspended in the first fluid are inhibited from engaging the selected binding sites.

13 Claims, 22 Drawing Sheets

U.S. PATENT DOCUMENTS

| | | |
|---|---|---|
| 2002/0153606 A1 | 10/2002 | Gengel |
| 2003/0068519 A1 | 4/2003 | Brewer et al. |
| 2003/0140317 A1 | 7/2003 | Brewer et al. |
| 2003/0155151 A1 | 8/2003 | Hermanns et al. |
| 2003/0182794 A1 | 10/2003 | Fonstad, Jr. et al. |
| 2003/0183904 A1 | 10/2003 | Fonstad, Jr. et al. |
| 2003/0186469 A1 | 10/2003 | Fonstad, Jr. et al. |
| 2004/0068864 A1 | 4/2004 | Hadley et al. |

OTHER PUBLICATIONS

Uthara Srinivasan et al., "Microstructure to Substrate Self-Assembly Using Capillary Forces", Journal of Microelectromechanical Systems, vol. 10, No. 1, Mar. 2001, pp. 17-24.

H. McNally et al., "Self-Assembly of Micro- and Nano-Scale Particles Using Bio-Inspired Events", Applied Surface Science, 214 (2003), pp. 109-119.

S.W. Lee et al., "Electric-Field-Mediated Assembly of Silicon Islands Coated with Charged Molecules", Langmuir, American Chemical Society, 2002, vol. 18, pp. 3383-3386.

Y. Murakami et al., "Random Fluidic Self-Assembly of Micro-Fabricated Metal Particles", Proc. 1999 International Conference Solid-State Sensors and Actuators, Japan, Jun. 1999, pp. 1108-1111.

Andrew Rodd et al., "Gel Point Studies for a Novel Biopolymer-Crosslinker Gelling System", 2000, 13$^{th}$ International Congress on Rheology, pp. 4-389-4-391.

C.R. Barry et al., "Approaching Programmable Self-Assembly from Nanopartical-Based Devices to Integrated Circuits", Proceedings of the Foundation of Nanoscience, Apr. 21-23, 2004, pp. 1-8, XP-002367627.

FIG. 2B
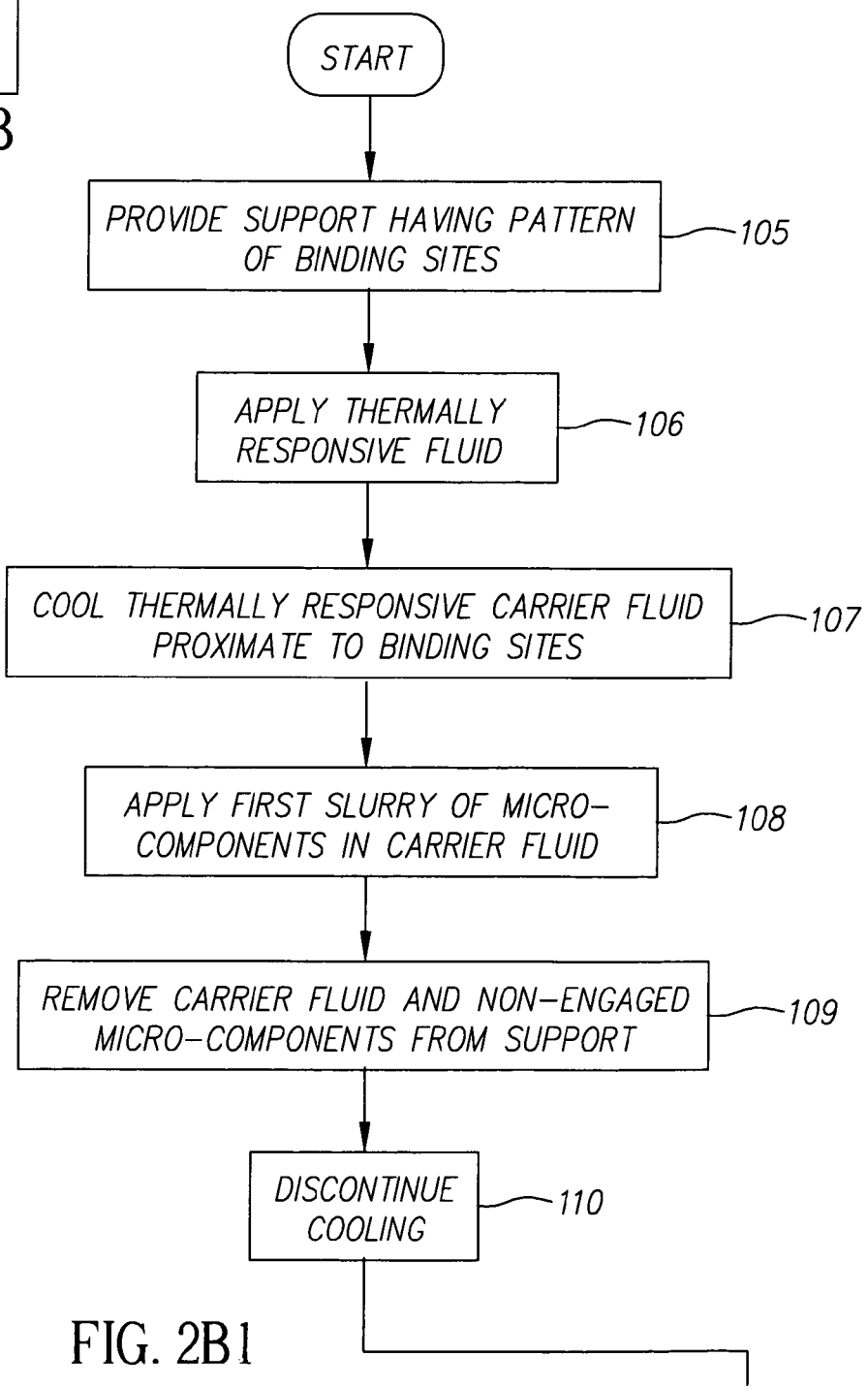
FIG. 2B1

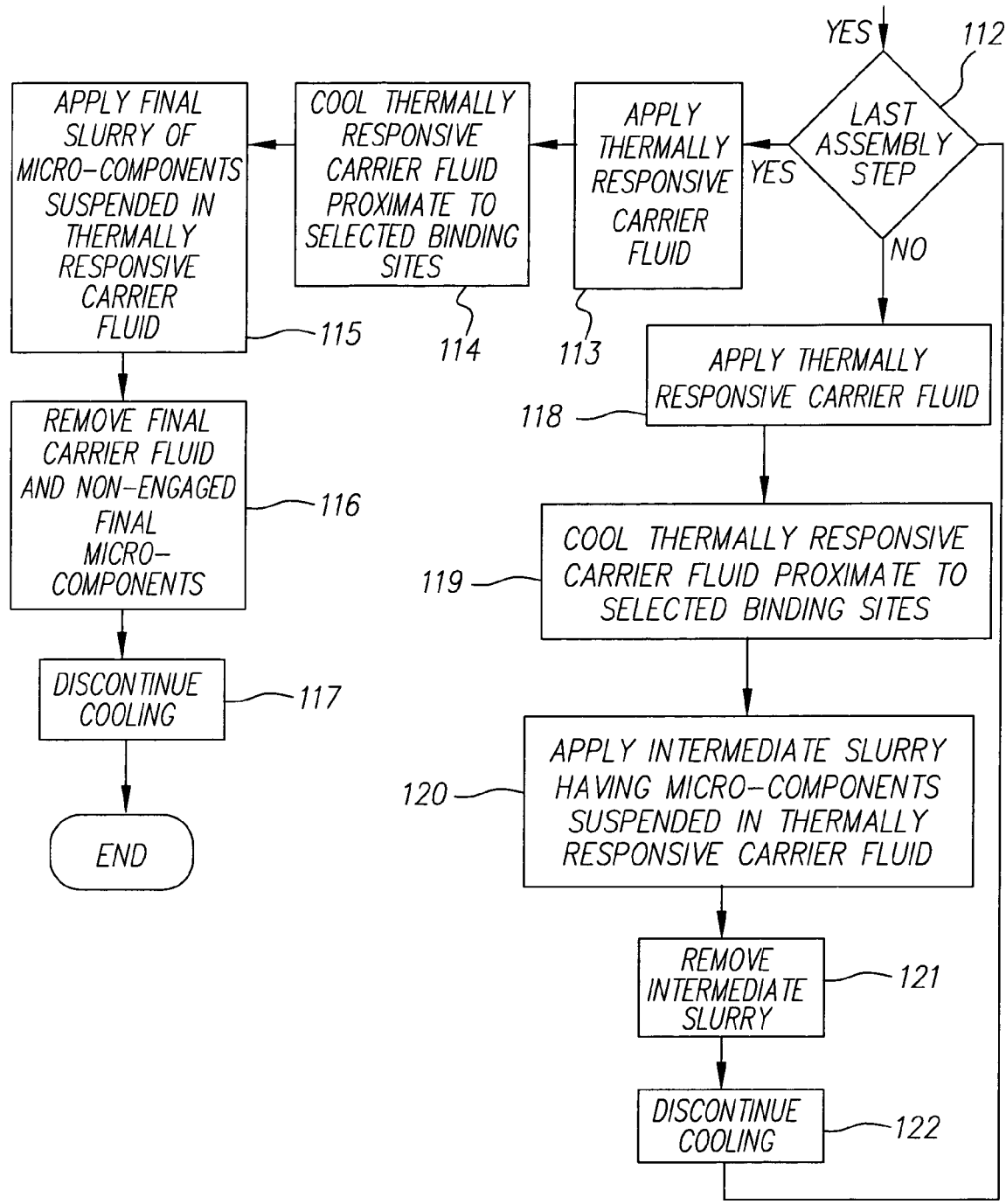
FIG. 2B2

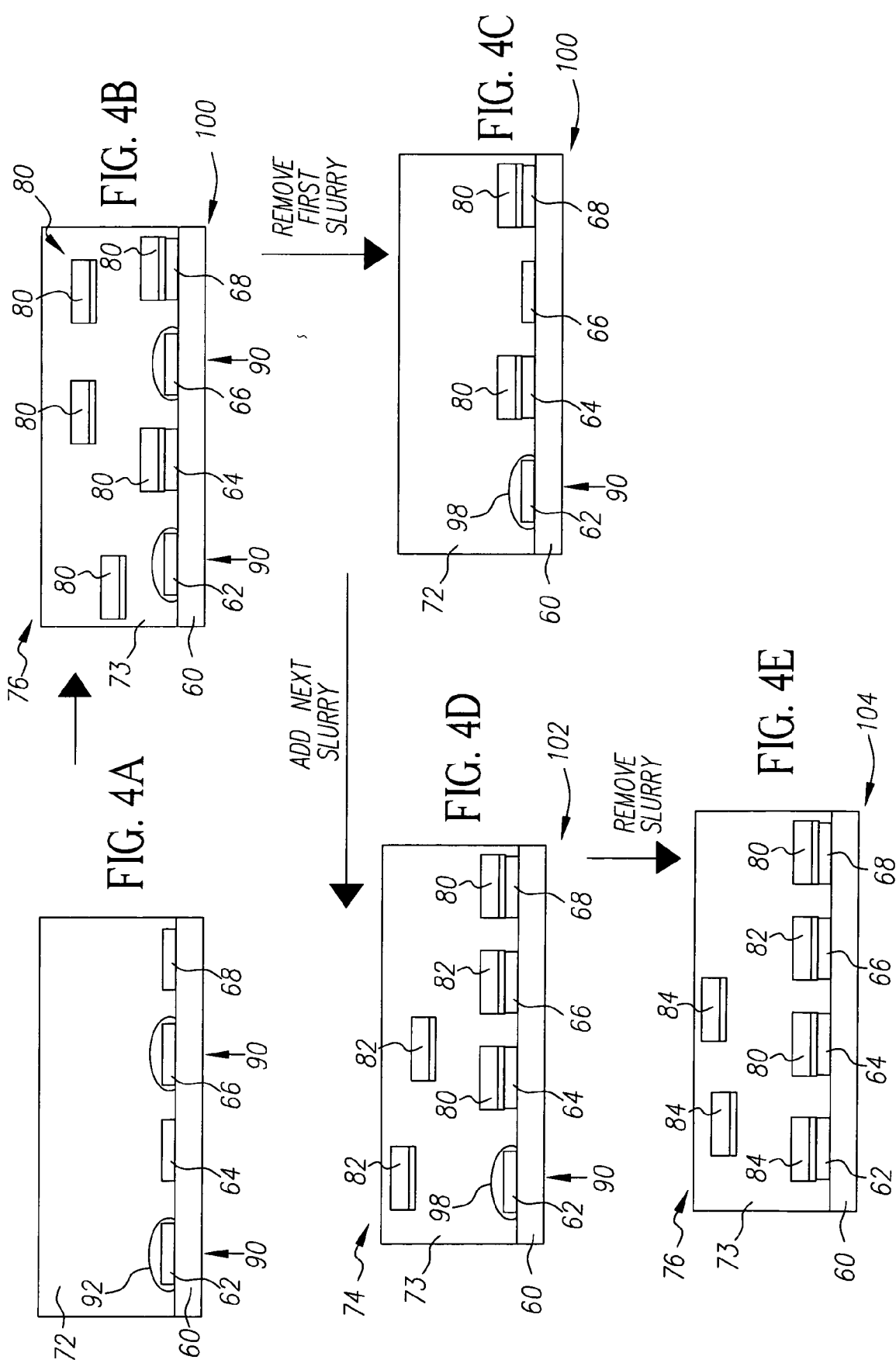

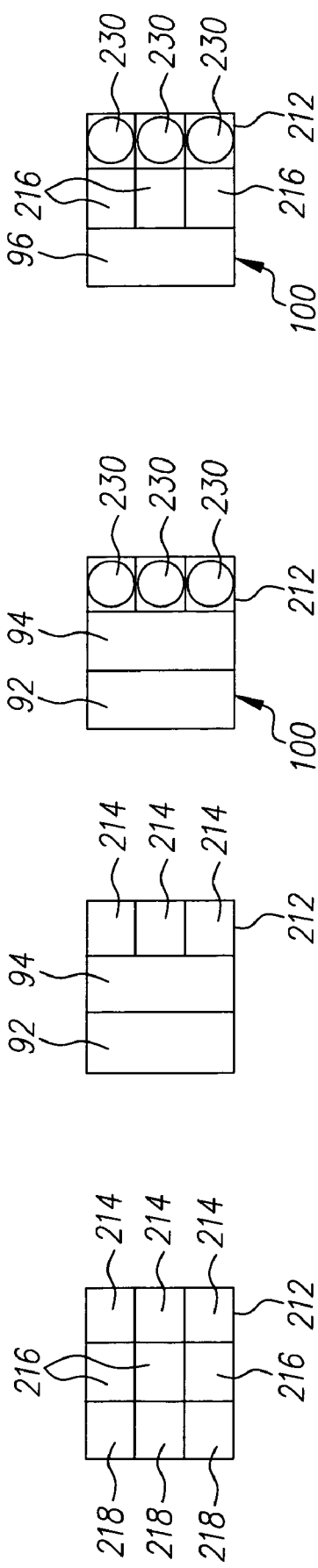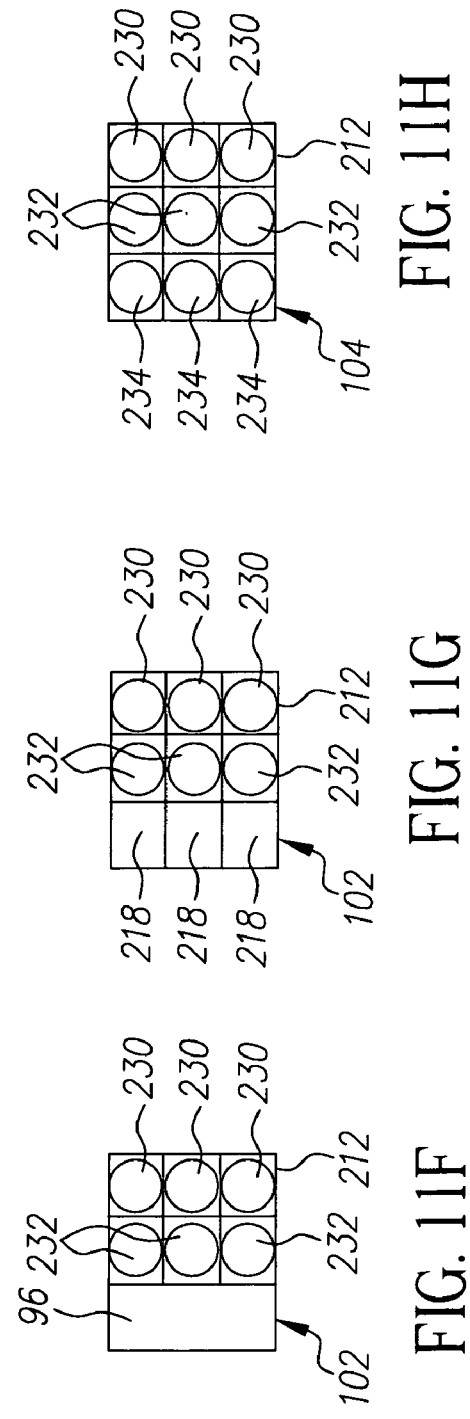

THERMALLY CONTROLLED FLUIDIC SELF-ASSEMBLY

CROSS-REFERENCE TO RELATED APPLICATIONS

Reference is made to commonly assigned, co-pending patent application U.S. Ser. No. 10/849,302, entitled THERMALLY CONTROLLED FLUIDIC SELF-ASSEMBLY METHOD AND SUPPORT, filed Sep. 3, 2004 in the names of Daniel D. Haas et al.; and U.S. Ser. No. 10/849,329, entitled THERMALLY CONTROLLED FLUIDIC SELF-ASSEMBLY AND CONDUCTIVE SUPPORT, filed Sep. 3, 2004 in the names of Theodore K. Ricks et al.

FIELD OF THE INVENTION

The present invention relates to methods for fluidic micro-assembled structure and, in particular, to methods and apparatuses for selective fluidic assembly of micro-components.

BACKGROUND OF THE INVENTION

Micro-assembled devices offer the promise of an entirely new generation of consumer, professional, medical, military, and other products having features, capabilities and cost structures that cannot be provided by products that are formed using conventional macro-assembly and macro-fabrication methods. For example, there is a need, particularly in the field of flat panel displays, smart cards and elsewhere, for microelectronic devices or chips that can be integrated into or assembled as either a system or as an array, in a relatively inexpensive manner. In another example, there is a need for a cost effective method for allowing accurate and cost effective assembly of colored display elements such as electrophoretic beads in specific locations on display panels.

One advantage of such micro-assembled devices is that they can utilize different materials and devices (a process generally termed heterogeneous integration) in ways that create new product possibilities. For example, such heterogeneous integration provides the opportunity for relatively rigid structures such as such as silicon transistors or other electronic devices to be assembled into more complex electronic circuits using a flexible substrate as opposed to the rigid silicon substrates currently used for this purpose. In this example, such heterogeneous integration would provide a less expensive means to assemble silicon based integrated circuit components and/or any other kind of circuit components to form integrated circuits on flexible or rigid supports that are not made from silicon. However, it will be appreciated that in providing such heterogeneous integrated circuits, it is necessary that these processes provide for precise placement of multiple types of independent structures on the substrate. Such heterogeneous integration can also be used for other purposes. For example, heterogeneous integration can be used for purposes such as the assembly of pharmaceutical products, advanced materials, optical structures, switching structures, and biological structures.

Of particular interest in the electronic industry is the potential for micro-assembly to solve existing problems in the assembly of highly desirable but complex structures used in forming electronic displays. Typical electronic displays use a structure known as a "front plane" as the image forming surface. The "front plane" comprises an arrangement of image forming elements also known as active elements formed from structures such as liquid crystals, electroluminescent materials, organic light emitting diodes (OLEDs), up converting phosphors, down converting phosphors, light emitting diodes, electrophoretic beads, or other materials that can be used to form images. Such active elements typically form images when an electric field or some other stimulus or other field is applied thereto. Such electronic displays also incorporate a structure known as a "back plane" that comprises structures such as electrodes, capacitors, transistors, conductors, and pixel drivers and other circuits and integrating components that are intended to provide appropriate stimulus to the active components to cause the active components to present an image. For example, the active components can react to stimulus by emitting controlled amounts of light or by changing their reflectivity or transmissivity to form an image on the front plane.

It is well known to use heterogeneous integration methods to place elements on a substrate. Such heterogeneous integration methods can be generally divided into one of two types: deterministic methods and random methods. Deterministic methods use a human or robotic structure to place individual elements into particular locations on the substrate. Such methods are also known as "pick and place" methods. Such "pick and place" methods offer two advantages: complete control and positive indication that components have been appropriately placed in a desired location. Further, such "pick and place" methods also allow the precise assembly of different types of micro-components to form a micro-assembled structure that integrates different types of materials, micro-assembled structures and components.

It will be appreciated that deterministic methods require a high degree of precision by the person or machine executing the deterministic assembly process. Accordingly, such deterministic methods are difficult to apply in a cost effective manner. This is particularly true where the assembly of micro-components is to occur at a high rate of assembly or where large-scale assembly of micro-components is to be performed such as is required in commercial, pharmaceutical, or other applications.

Random placement methods such as fluidic self-assembly have been used to integrate electronic devices such as GaAs LEDs onto silicon substrates. Fluidic self-assembly is a fabrication process whereby a large number of individual shaped micro-assembled structures are integrated into correspondingly shaped recesses on a substrate using a liquid medium for transport. This method of self-assembly relies on gravitational and shear forces to drive the self-assembly of micro-components. Examples of this include U.S. Pat. No. 5,545,291 filed by Smith et al. on Dec. 17, 1993 entitled "Method for Fabricating Self-Assembling Micro-Assembled Structures"; U.S. Pat. No. 5,783,856 filed by Smith et al. on May 9, 1995 entitled "Method for Fabricating Self-Assembling Micro-Assembled Structures"; U.S. Pat. No. 5,824,186 filed by Smith et al. on Jun. 7, 1995 entitled "Method and Apparatus for Fabricating Self-Assembling Micro-Assembled Structures"; and U.S. Pat. No. 5,904,545 filed by Smith et al. on Jun. 7, 1995 and entitled "Apparatus for Fabricating Self-Assembling Micro-Assembled Structures".

FIG. 1A illustrates, generally, the operation of one type of prior art random placement method. In FIG. 1A, a substrate 10 is shown having binding sites in the form of recesses 21 that are shaped to accept correspondingly shaped micro-components 47 suspended in a fluid 29. As is shown in FIG. 1A, fluid 29 contains micro-components 47 and is applied to substrate 10. When this occurs, gravity and/or other forces draw micro-components 47 onto substrate 10 and into recesses 21. This allows for the assembly of micro-components 47 to substrate 10 using a massively parallel process that is more suitable for high volume and/or large-scale assembly processes.

Other approaches have been developed for using fluidic self-assembly to build a micro-assembled structure without relying exclusively on gravitational and/or shear forces. Some of these are illustrated in FIGS. 1B-1E. In each of FIGS. 1B-1E, a substrate 10 is shown having binding sites 22-25. Binding sites 22-25 can take many forms, only some of which are shown in FIGS. 1B-1E.

In FIG. 1B, a fluidic self-assembly method is shown wherein a substrate 10 is provided having binding sites 22 that are adapted with hydrophobic patches that engage with hydrophobic surfaces 48 on micro-components 49 suspended in fluid 29 and thereby locate the micro-components 49 on substrate 10. One example of this type is shown and described in U.S. Pat. No. 6,527,964 filed by Smith et al. on Nov. 2, 1999 entitled "Method and Apparatuses for Improved Flow in Performing Fluidic Self-Assembly." The '964 patent describes a substrate that is exposed to a surface treatment fluid to create a surface on the substrate that has a selected one of a hydrophilic or a hydrophobic nature. A slurry is dispensed over the substrate. The slurry includes a fluid and a plurality of the micro-components. Two types of micro-components are provided: one that is designed to adhere to a hydrophilic surface associated with a co-designed receptor site and one that is designed adhere to a hydrophobic surface associated with a co-designed receptor site. As the slurry is dispensed over the substrate 10, the selectively hydrophilic surfaces of selected ones of the micro-components adhere to hydrophilic surfaces on substrate 10, while not adhering to hydrophobic surfaces. Micro-components that have a hydrophilic surface engage hydrophilic patches on the substrate. Thus, micro-components are selectively placed in predefined locations on the substrate.

FIG. 1C shows another fluidic self-assembly method. The method illustrated in FIG. 1C uses capillary forces for self-assembly. As is shown in FIG. 1C, binding sites 23 are adapted with drops 32 of a liquid 34. Capillary attraction between liquid 34 and surface 36 on micro-components 51 causes micro-components 51 suspended in fluid 29 to assemble on binding sites 23. However, it will be appreciated that this method requires the precise placement of drops of liquid 34 on substrate 10 and does not necessarily provide the discrimination useful in the assembly of components having multiple types of micro-components. Various versions of this method are described generally in Tien et al. (J. Tien, T. L. Breen, and G. M. Whitesides, "*Crystallization of Millimeter-Scale Objects with Use of Capillary Forces,*" *J. Amer. Chem. Soc.*, vol. 120, pp. 12 670-12 671, 1998) and Srinivasan et al. (U. Srinivasan, D. Liepamann, and R. T. Howe, J. *Microelectromechanical systems* Vol. 10, 2001, pp. 17-24).

In the prior art illustrated in FIG. 1D, a fluidic self-assembly method is shown wherein binding sites 24 include magnetic patches that attract a magnetic surface 53 on micro-component 52 suspended in fluid 29. Such an approach is described in Mukarami et al. (Y. Murakami, K. Idegami, H. Nagai, A. Yamamura, K. Yokoyama, and E. Tamiya, "*Random fluidic self-assembly of micro-fabricated metal particles,*" in *Proc.* 1999 *Int. Conf Solid-State Sensors and Actuators*, Sendai, Japan, Jun. 7-10, 1999, pp. 1108-1111.) which describes in greater detail the use of magnetic forces to assemble microscopic metal disks onto a substrate patterned with arrays of nickel dots. However, high cost is encountered in providing the arrays of disks on the substrate. Further such methods are typically limited to applications wherein the micro-assembled structures being assembled each have magnetic characteristics that permit the use of magnetic forces in this fashion.

Electrostatic attraction has been proposed for use in positioning micro-components during micro-assembly. U.S. Patent Application Publication No. 2002/0005294 filed by Mayer, Jackson and Nordquist, entitled "Dielectrophoresis and Electro-hydrodynamics Mediated Fluidic Assembly of Silicon Resistors"; and S. W. Lee, et al., Langmuir "Electric-Field-Mediated Assembly of Silicon Islands Coated With Charged Molecules", Volume 18, pp. 3383-3386, (2002) describe such methods. FIG. 1E illustrates a general example of this electrostatic approach. As is shown in FIG. 1E, substrate 10 has binding sites 25 that are adapted with electrodes 27 that attract oppositely charged micro-components 55 suspended in fluid 29. However, the use of electrostatically based fluidic micro-assembly can involve high cost associated with providing addressable electrode structures required for long range transport of micro-components by dielectrophoresis.

As noted above, many micro-assembled structures incorporate a variety of different types of micro-components. Thus, heterogeneous integration of more than one type of micro-component using such a massively parallel random placement process, such as fluidic micro-assembly, is highly desirable. What is needed therefore is a method for assembling micro-components into a micro-assembled structure on the massive scale enabled by random placement methods such as conventional fluidic assembly but with the precision and selective assembly capabilities of deterministic methods.

Modifications to at least one of the fluidic self-assembly methods described above have been proposed in an attempt to meet this need. For example, in one approach, conventional fluidic assembly techniques have evolved that use differently shaped micro-components that are adapted to engage differently shaped receptor sites on a substrate. This requires that the substrate has binding sites that are uniquely shaped to correspond to a shape of a particular type of micro-component. However, the constraints of surface etching techniques, micro-component formation techniques, cost, electrical function, and orientation limit the number of shape configurations that are available for use in discrimination, which in turn limits the number of different components that can be placed on the substrate using such a process.

In another approach, Bashir et al. discuss the use of binding between complementary DNA molecules or ligands to discriminate between binding sites. While this approach provides a high degree of differentiation high cost may be encountered in patterning the DNA or ligands on the substrate. (H. McNally, M. Pingle, S. W. Lee, D. Guo, D. Bergstrom, and R. Bashir, "*Self-Assembly of Micro and Nano-Scale Particles using Bio-Inspired Events*", *Applied Surface Science*, vol. 214/1-4, pp 109-119, 2003).

Thus, there is a need for a more cost effective method for the high volume heterogeneous assembly of micro-components.

SUMMARY OF THE INVENTION

In one aspect of the invention, a method is provided for assembling a structure on a support having a pattern of binding sites. In accordance with the method, a first fluid is provided on the surface of the support with the first fluid being of a type that that increases viscosity when cooled, the first fluid having first micro-components suspended therein each adapted to engage the binding sites. First fluid proximate to selected binding sites is cooled to increase the viscosity of the responsive fluid proximate to the selected binding sites so that the first micro-components suspended in the first fluid are inhibited from engaging the selected binding sites.

In another aspect of the invention, an apparatus is provided for assembling a micro-assembled structure on a support having binding sites thereon. The apparatus has a fluid source adapted to apply a first fluid having first micro-components therein onto the support, said first micro-components being adapted to engage the binding sites and said first fluid being of a type that increases viscosity when cooled; and a cooling applicator adapted to apply a cooled material to the support so that the support cools the first fluid to increase the viscosity of the first fluid proximate to the selected binding sites so that micro-components are inhibited from engaging the selected binding sites.

BRIEF DESCRIPTION OF THE DRAWINGS

FIG. 2B is a flow diagram of another embodiment of the method of the invention for use in assembling several different types of micro-components;

FIGS. 4A and 4B illustrate the assembly of a first type of micro-component to a support to form a first micro-assembled structure;

FIGS. 4C and 4D illustrate the assembly of an intermediate type of micro-component to first micro-assembled structure to form an intermediate micro-assembled structure;

FIG. 4E illustrates the assembly of a final type of micro-component to the intermediate micro-assembled structure to form a final micro assembled structure;

FIGS. 11A-11H provide illustrations depicting the application of one embodiment or method and apparatus of the invention in the assembly of a display.

DETAILED DESCRIPTION OF THE INVENTION

Figure 1A:
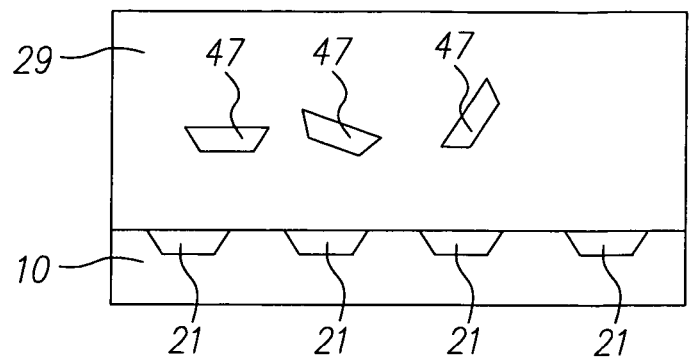
FIGS. 1A-1E illustrate various types of methods that are known in the prior art for fluidic self-assembly.
Figure 1B:
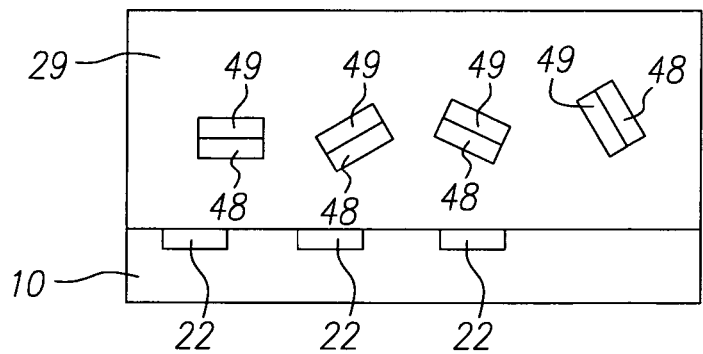
Figure 1C:
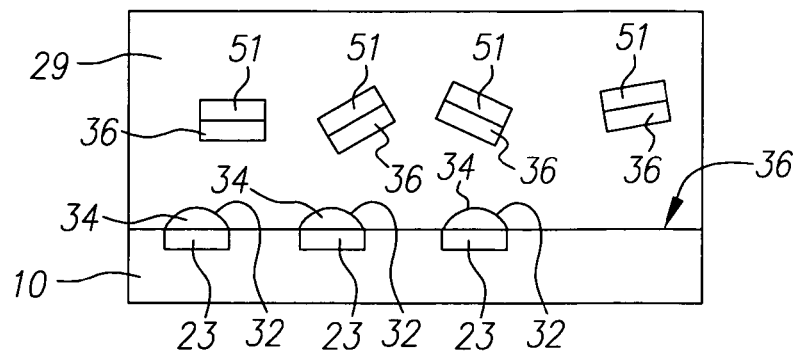
Figure 1D:
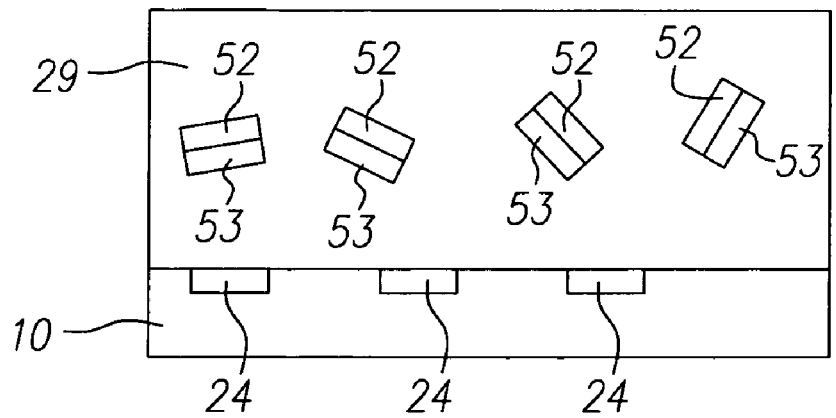
Figure 1E:
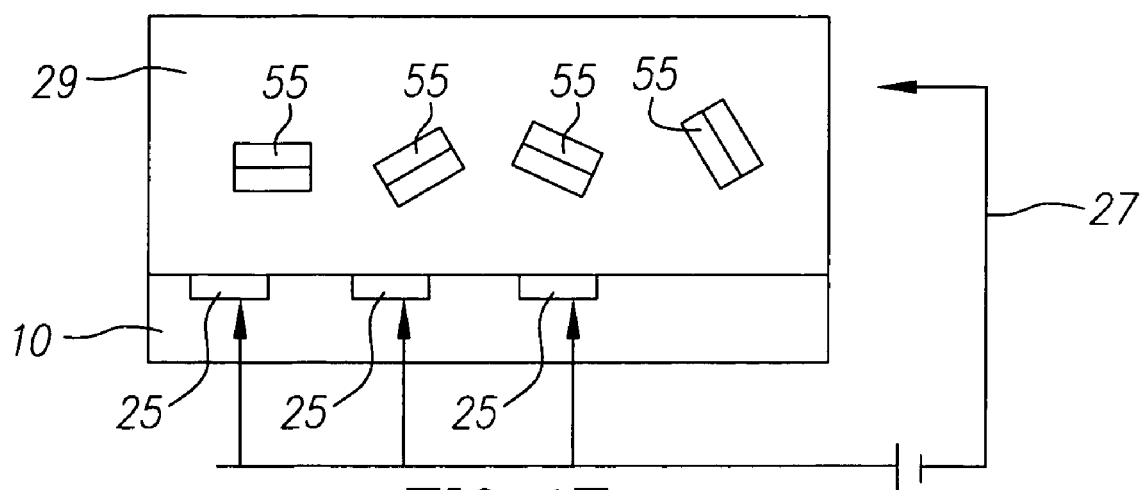
Figure 2A:
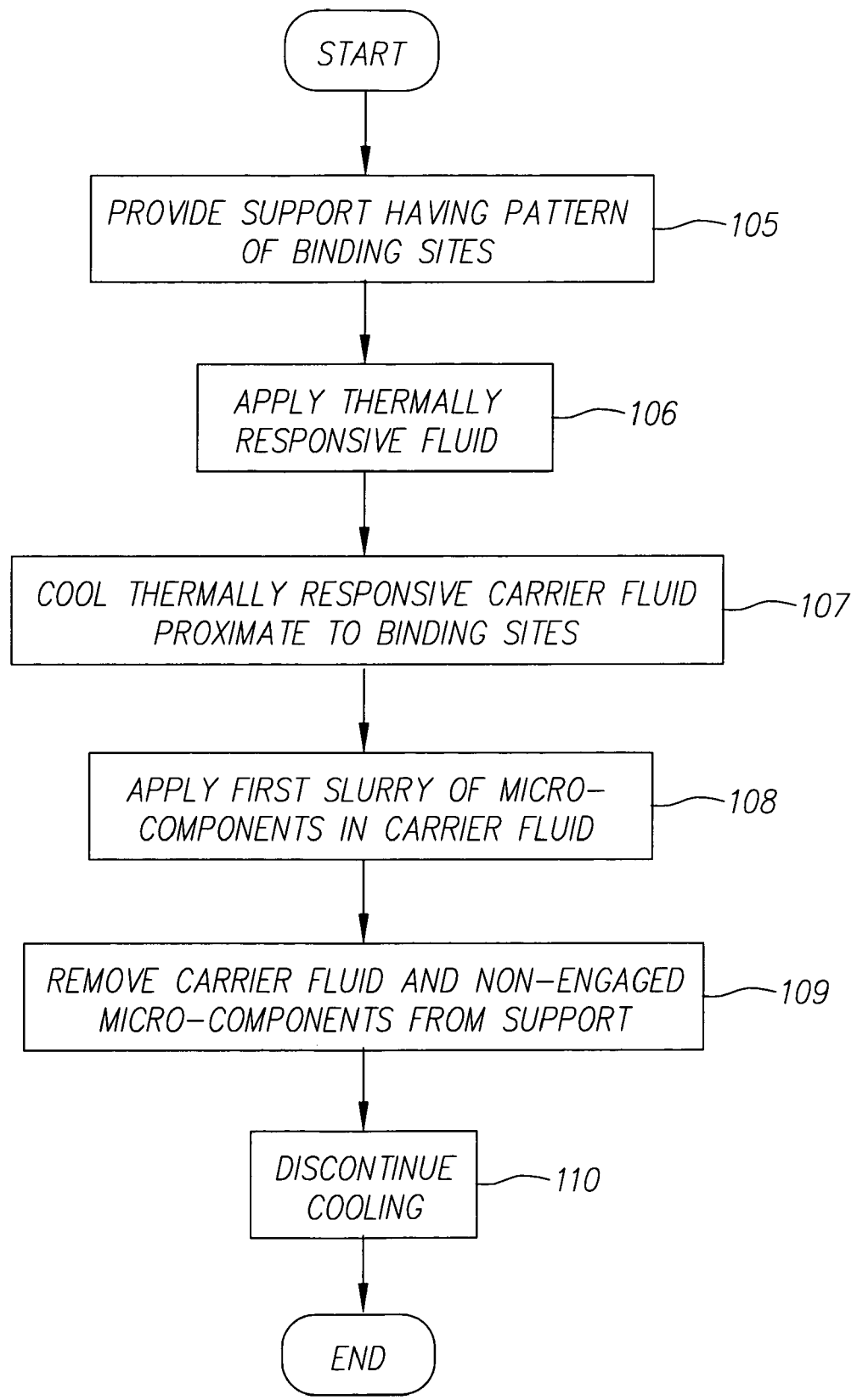
FIG. 2A is a flow diagram of one embodiment of the method of invention.
Figure 3A:
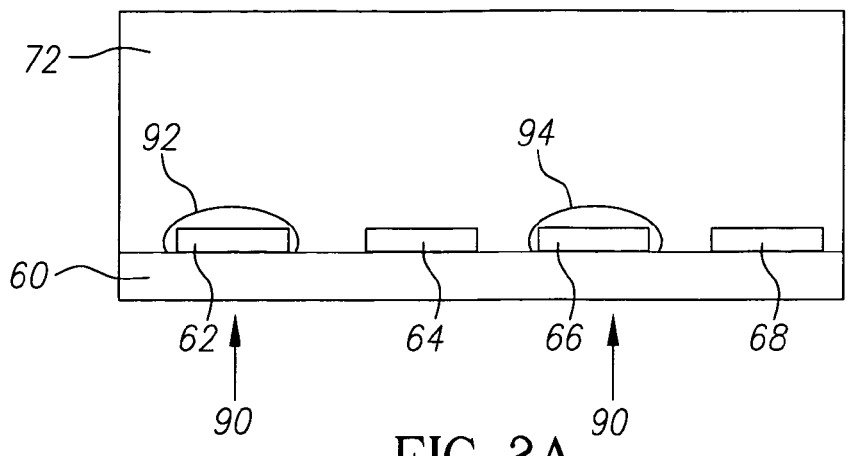
FIGS. 3A-3C illustrate fluidic self-assembly in accordance with the method of FIGS. 2A and 2B.
Figure 3B:
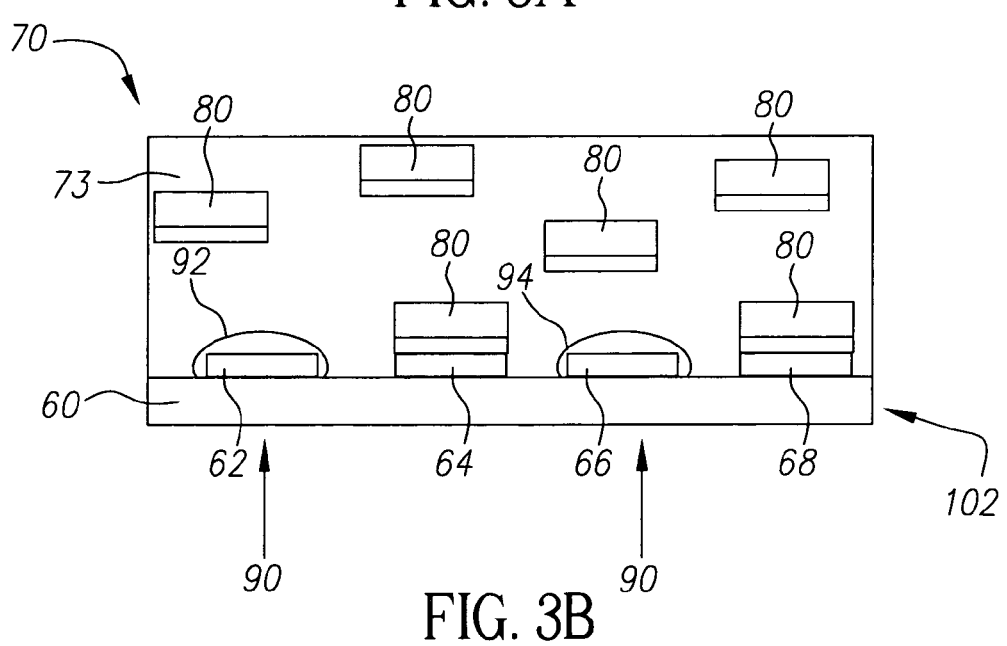

FIG. 2A is a flow diagram of one embodiment of the method of invention. FIGS. 3A and 3B illustrate one example of fluidic self-assembly in accordance with the method of FIG. 2A. As is shown in FIG. 3A, a support 60 is provided (step 105). Support 60 can be, but is not limited to, a flexible support such as polyethylene terephthalate, cellulose acetate, polyethylene, polycarbonate, polymethyl methacrylate, polyethylene napthalate, metal foils, cloth, fabric, woven fiber or wire meshes or rigid supports such as glass and silicon.

Figure 3C:
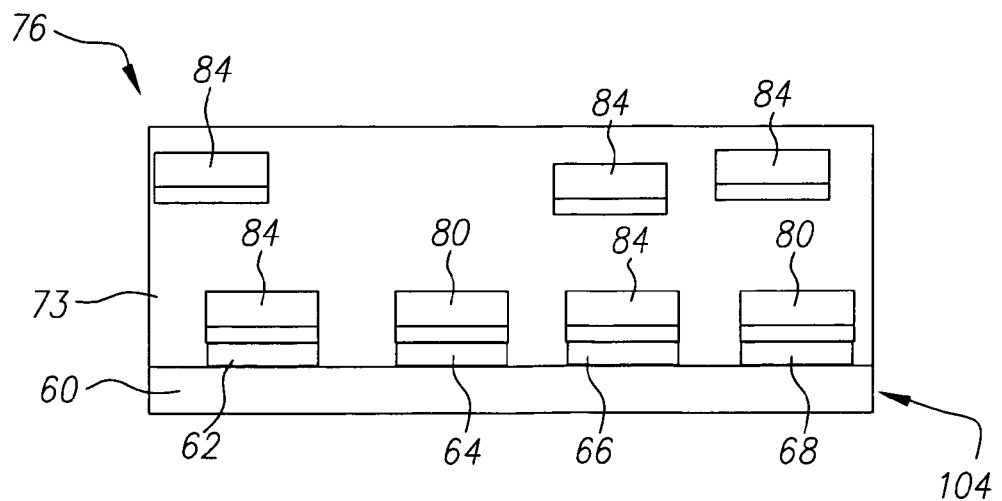

Support 60 has pattern of binding sites shown in FIGS. 3A-3C as binding sites 62, 64, 66 and 68. Each binding site 62, 64, 66 and 68 is adapted so that a micro-component can be assembled thereon, such as by shaping binding sites 62, 64, 66 and 68 to receive the micro-component. Alternatively, support 60 can have binding sites 62, 64, 66 and 68 that are adapted to engage micro-components using, for example, shape matching, magnetic force, electrical force, hydrophobic attraction, hydrophilic attraction, molecular recognition, and/or capillary attraction as described in the prior art.

In operation, a thermally responsive fluid 72 is applied to support 60 (step 106). In the embodiment shown in FIGS. 2 and 3A-3B this is done by flowing a thermally responsive fluid 72 across support 60. However, in other embodiments, thermally responsive fluid 72 can be applied to support 60 in other ways such as by immersing support 60 in a bath of thermally responsive fluid 72.

As used herein, the term thermally responsive fluid is used to mean a fluid that increases its viscosity upon cooling. Examples of useful thermally responsive fluids include, but are not limited to, aqueous solutions of polymers, polyelectrolytes, polyampholytes (e.g. gelatin solutions), gums, polysaccharides (e.g. gellan, carregeenan, and agarose) or combinations thereof that increase viscosity upon cooling. The useful range of any of these thermally responsive fluids depends factors that can include the gel transition temperature required and that, in turn, depends upon the concentration of polymer, ionic strength, type of ions, pH, and molecular weight of polymer and the distribution of charged groups of the polymer. For example, a useful thermally responsive solution include an aqueous gelatin solution between 1-20% gelatin for a gelatin molecular weight of 120K Daltons.

Still other examples of a thermally responsive fluid include aqueous solutions 0.1 wt % or higher of agarose, 0.4 wt % gellan or higher. The gel transition temperature of these solutions is approximately 15 C.

In still other embodiments, a thermally responsive fluid can comprise solutions of any polymer that interacts with a colloid to form a thermally responsive liquid that gels upon cooling. For example, the thermally responsive fluid can comprise a mixture of gelatin and, for example, colloidal silicas such as Ludox® sold by WR Grace and Co., Davison Silica Products Division, East Chicago, Ind., U.S.A.

In yet another embodiment, a thermally responsive fluid can comprise an aqueous solution of xanthan gum with trivalent metal ions. For example, a gel transition temperature of between 25-75 C is achievable with 0.5 wt % xanthan combined with Aluminum ions as is described in Proceedings of the 13$^{th}$ International Congress on Rheology, Cambridge, UK, 2000, Volume 4, pp. 389, by Andrew Rodd.

The aqueous solutions described herein can include but are not limited to alcohols and polyethylene glycol. Non-aqueous solutions can also be used. For example, a thermally responsive fluid can be provided that incorporates chlorinated solvents and other non-aqueous solvents.

In application, thermally responsive fluid 72 is cooled in areas in and/or near selected binding sites on support 60, shown in the embodiment FIGS. 3A and 3B as binding sites 62 and 66 (step 107). Thermally responsive fluid 72 is typically cooled in an indirect fashion. FIGS. 3A-3C illustrate an example of indirect cooling of thermally responsive fluid 72. In the example shown in FIG. 3A, a cooling material 90 is applied to support 60 in areas proximate to selected binding sites 62 and 66. In response to the application of the cooling material 90, support 60 is cooled in areas proximate to selected binding sites 62 and 66. When thermally responsive fluid 72 comes into contact with cooled areas of support 60, the viscosity of thermally responsive fluid 72 increases. This creates barrier zones 92 and 94 within thermally responsive fluid 72. Barrier zones 92 and 94 have a viscosity that is higher than the viscosity of other areas of thermally responsive fluid 72. Barrier zones 92 and 94 in certain embodiments can comprise fluid, gelatinous, or solid forms of first thermally responsive fluid 72. Barrier zones 92 and 94 interfere with the ability of micro-components 80 to engage binding sites 62 and 66.

Accordingly, as is shown in FIG. 3B, after barrier zones 92 and 94 have been formed at binding sites 62 and 66, a first slurry 70 of a carrier fluid 73 and a first type of micro-components 80 are applied to support 60 (step 108). Carrier fluid 73 can comprise any fluid that can carry micro-components 80 to support 60 and be usefully applied for fluidic self-assembly. In one embodiment, carrier fluid 73 comprises a thermally responsive fluid. In one embodiment, the step of applying a thermally responsive fluid (step 106), cooling the thermally responsive fluid to form barrier zones (step 107) and applying a first slurry (step 108) can be integrated such that the first slurry is applied by introducing first micro-components 80 into the thermally responsive fluid 72 already applied in step 106. However, this is not necessary and carrier fluid 73 does not, in itself, have to comprise a thermally responsive fluid. This can be done where the barrier zones 92 and 94 formed in first fluid 72 will persist during application of carrier fluid 73.

Micro-components 80 can include, but are not limited to, integrated circuits on silicon, nanowires, beads, rods, cubes, disks, buckey balls, capsules, electrophoretic beads, LEDs, light emitting materials, light reflecting materials, light absorbing materials, conductive materials, magnetic materials, dielectric materials, aerogels, biological cells, DNA and DNA derivatives, and DNA templated structures. Micro-components 80 can be sized within any range of sizes that can effectively be suspended in solution in the thermally responsive fluid. In this regard, in selected embodiments, micro-components 80 can be sized as small as 1 nanometer, and as large as several millimeters.

The first type of micro-components 80 are adapted to engage binding sites 62, 64, 66 and 68 as is known generally in the art described above. However, in the illustration of FIGS. 3A-3C, it is not intended that the first type of micro-components 80 engage selected binding sites shown in this illustration as binding sites 62 and 66. Accordingly, barrier zones 90 and 92 inhibit such engagement. Specifically, it will be appreciated that micro-components 80 typically follow a path of least resistance as they move about in carrier fluid 73. Accordingly, where micro-components 80 encounter barrier zones 92 and 94 of higher viscosity, micro-components 80 will be deflected away from barrier zones 92 and 94 and therefore will not engage binding sites 62 and 66. However, micro-components 80 are able to engage binding sites 64 and 68 which are not protected by barrier zones 92 and 94.

After first type micro-components 80 have been assembled to each of the non-selected sites 64 and 68, first carrier fluid 73 and any non-engaged first micro-components 80 are removed from first micro-assembled structure 100 (step 109). This can be done by mechanical action, by vacuum, or by rinsing, for example. In one embodiment, a liquid such as thermally responsive fluid 72 is rinsed over support 60 to remove any of the first type of micro-components 80 that remain on support 60 and that are not bound to one of binding sites 62, 64, 66 or 68. During removal of first slurry 70, cooling material 90 remains in contact with support 60 proximate to selected binding sites 62 and 66 so that barrier zones 92 and 94 remain in place to prevent any non-engaged micro-components 80 of the first type from binding to the selected sites 62 and 66 during removal of first slurry 70. The cooling material 90 can be removed from support to stop the cooling of support 60 proximate to binding sites 62 and 66 after removal of the first slurry 70 is complete (step 110). When cooling material 90 is removed from support 60, the temperature of support 60 increases and barrier zones 92 and 94 that are created as a result of such local temperature decreases also dissipate. A first micro-assembled structure 100 is formed as a result of the union of the first type of micro-components 80 with support 60. This first micro-assembled structure 100 can, in some embodiments such as the embodiment of FIG. 2A, comprise a final micro-assembled structure 104.

Additional micro-components can also be assembled to first micro-assembled structure 100. FIGS. 2B and 3A-3C illustrate on embodiment of a method for assembling more than one micro-component to a support. The embodiment of FIG. 2B incorporates the method steps of FIG. 2A and adds additional steps 112-122. In accordance with the method of FIG. 2B, steps 105-110 are performed as described above. Then additional micro-components can be provided that are adapted to engage binding sites on support 60 in order to form an intermediate micro-assembled structure 102 or final micro-assembled structure 104 as described below. Such additional components can be the first type of micro-components 80 or, as shown in FIG. 3C, a final type of micro-components 84.

When it is determined that only one further assembly step is necessary to create a final micro-assembled structure 104 (step 112), a final slurry 76 of carrier fluid 73 having a final type of micro-component 84 is applied to first micro-assembled structure 100 (step 115). This enables a final type of micro-components 84 to engage binding sites 62 and 66 and thus form a final micro-assembled structure 104 as illustrated in FIG. 3C. Carrier fluid 73 and any final micro-components 84 are removed to create a final micro-assembled structure. Optionally, thermally responsive fluid 72 can be applied to first micro-assembled structure 100 (step 113), and first micro-assembled structure 100 can be selectively cooled by the application of cooling material 90 so that thermally responsive fluid 72 is cooled to form barrier zones (not shown). Such barrier zones can be used to leave select binding sites unoccupied. The cooling material 90 is removed so that the cooling applied in optional step 114 is then stopped (step 117).

When it is determined that more than two micro-assembly steps are to be performed (step 112), such as for example, where more than two different types of micro-components are to be joined to support 60, additional steps 118-122, shown in FIG. 2B are performed. FIGS. 4A-4D illustrate the operation of the method of FIG. 2B wherein these additional steps are performed.

FIGS. 4A and 4B illustrate the assembly of a first type of micro-components 80 to a support 60 to form a first micro-assembled structure 100 in the same manner as is described above with reference to FIGS. 3A-3B (steps 105-110). As shown in FIG. 4C, a thermally responsive fluid 72 is applied to micro-assembled structure 100 (step 118) and a cooling material 90 is applied support 60 to form at least one barrier zone 98 (step 119). As shown in FIG. 4D, at least one intermediate slurry 74 comprising, a carrier fluid 73 and an intermediate type of micro-components 82 is then applied to support 60 (step 120). Further cooling materials 96 are also applied to cause thermally responsive fluid 72 of the intermediate slurry 74 to form at least one further barrier zone 98 proximate to, for example, binding site 62 (step 119). Because binding site 62 is insulated by barrier zone 98 and binding sites 66 and 68 are already engaged each with a first type of micro-component 80, only binding site 66 is available for fluidic assembly with intermediate type of micro-components 82. This forms an intermediate micro-assembled structure 102. The intermediate slurry 84 is then removed from support 60 (step 121) and energy is then removed (step 122). The process then returns for more assemblies of intermediate micro-components or for assembly of final micro-components 84 (steps 113-117).

Steps 111-122 can be repeated as necessary to permit many cycles of micro-assembly to occur, each with an additional application of an intermediate slurry 74 of a carrier fluid 73 bearing intermediate type micro-components 82 to a previously formed micro-assembled structure. In any of these additional steps, support 60 or intermediate micro-assembled structure 102 can be cooled as necessary to form barrier zones. When it is determined that only one further assembly step is to be performed (step 112) steps 113-117 are performed to yield a final micro-assembled structure 104 as shown in FIG. 4E.

As used herein, the first, intermediate, and final types of micro-components can comprise the same structures and can be different as necessary to permit formation of a heterogeneous micro-assembled structure.

Cooling of Support

The steps of cooling support 60 (steps 107, 114, and 119) can be performed in a variety of ways. As noted above, the thermally responsive fluid 72 is cooled indirectly by applying a cooling material 90 to support 60 or to some component of support 60 so that support 60 cools thermally responsive fluid 72. A cooling member 91 is typically used to perform this function, in various embodiments described herein. In particular, as will be described in greater detail below, cooling member 91 can comprise a pattern cooler or pattern roller that moves a cooled structure to apply a cooling material 90 to support 60. In other embodiments cooling member 91 can comprise a source of a cooling material in the form of a fluid such as a liquid or a gas and a nozzle to controllably deliver the fluid cooling material 91 to support 60. In still other embodiments cooling member 91 can comprise a control system for selectively electrical signals that actuate coolers in support 60.

In certain embodiments, a cooling material 90 is broadly applied to support 60 using, for example, a cooling plate or other surface of cooling material 90 and support 60 is adapted to react this in a selective way, and to thereby selectively cool the thermally responsive fluid 72. In other embodiments, cooling material 90 is selectively applied to selectively cool support 60 and to thereby selectively cool thermally responsive fluid 72.

FIG. 5A-5G show embodiments of the invention, wherein a support 60 is adapted with a set of coolers 132, 134, 136, and/or 138 that are positioned in association with support 60 proximate to selected binding sites shown as binding sites 62-68. Coolers 132, 134, 136 and 138 have different thermal response when cooled than the material forming support 60. When a cooling material 90 is broadly applied to support 60, coolers 132, 134, 136 and 138 can, for example, be cooled to a greater extent than surrounding material 60, or can be adapted to absorb energy from thermally responsive fluid 60 in an advantageous manner such as at a faster rate, or in a more localized manner than is possible by selectively cooling support 60.

Coolers 132, 134, 136, and 138 can comprise any of a variety of forms. In the example shown in FIG. 5A, a cooling material 90 is applied to support 60 proximate to binding sites 62 and 66, coolers 132 and 136 are cooled and, in turn, cool thermally responsive fluid 72 proximate to binding sites 62 and 66 to create barrier zones 92 and 94.

Figure 5A:
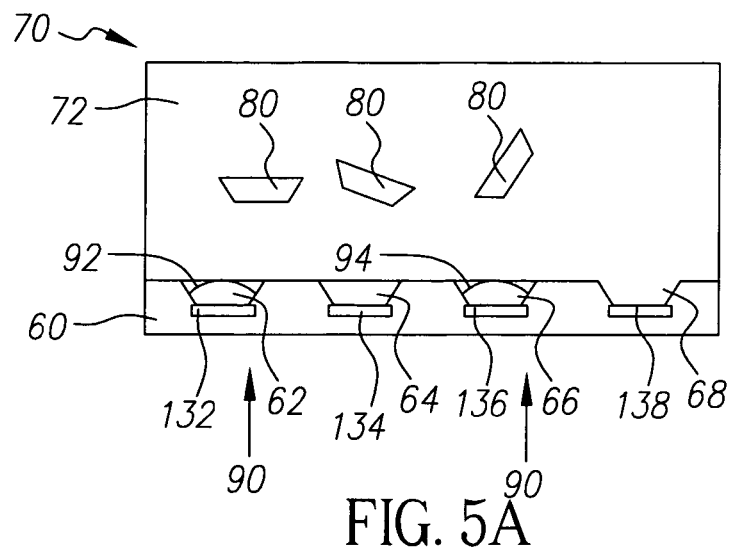
FIGS. 5A-5G show embodiments of the invention, wherein a set of coolers are incorporated into a support proximate to selected binding sites.
Figure 5B:
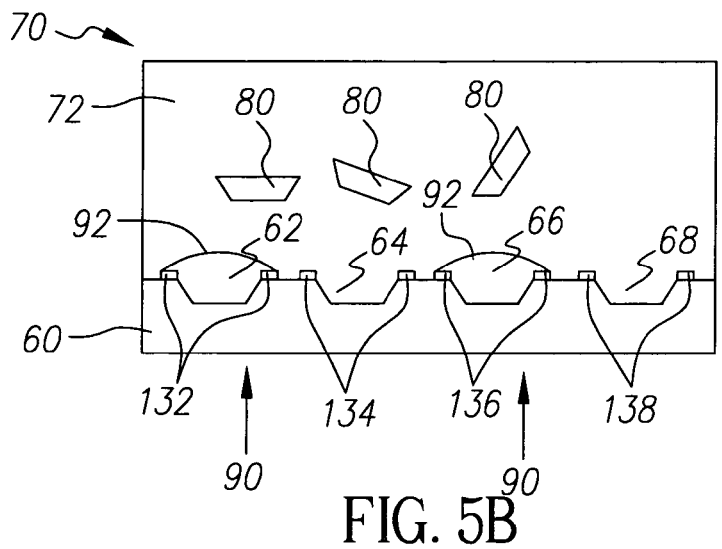

FIG. 5B shows another embodiment of a support 60 having an arrangement of coolers 132, 134, 136, and 138. In this embodiment, coolers 132, 134, 136, and 138 are positioned around and proximate to binding sites 62, 64, 66, and 68. A cooling material 90 is shown to be selectively applied to support 60 proximate to coolers 132 and 136 in the manner described above with respect to FIG. 4A to achieve the formation of barrier zones 92 and 94.

Figure 5C:
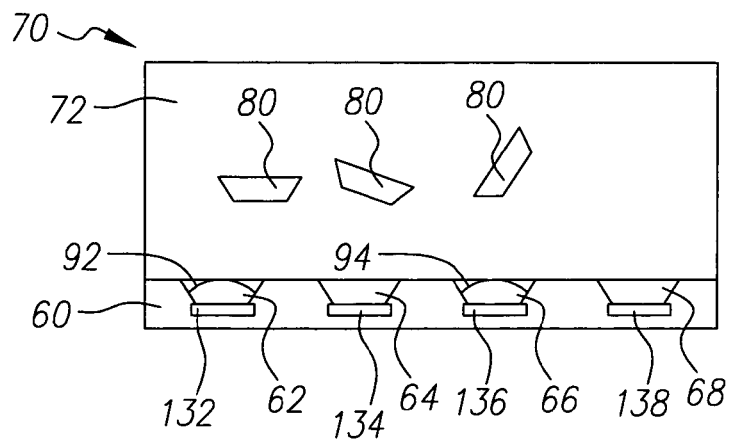

FIG. 5C shows another embodiment of a support 60 having an arrangement of coolers 132, 134, 136 and 138. Specifically, in the embodiment shown in FIG. 5C, each of binding sites 62, 64, 66 and 68 have an associated cooler 132, 134, 136, and 138 that is located in a portion of support 60 that is at a bottom most portion of binding sites 62, 64, 66 and 68. In this embodiment, when support 60 is cooled proximate to coolers 132, 134, 136, or 138 any thermally responsive fluid 72 in binding site 60, 62, 64, and 66 is cooled. This increases the viscosity of the thermally responsive fluid 72 in the binding sites to form for example, barrier zones 92 and 94 that can interfere with the ability of a micro-component 80 to be assembled to binding sites 62 and 66 respectively.

Figure 5D:
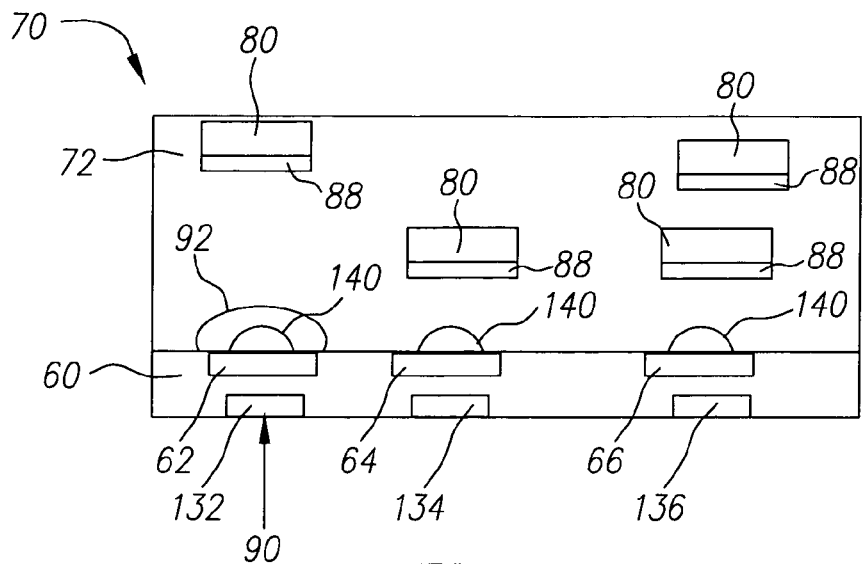

FIG. 5D shows still another embodiment of a support 60 having an arrangement of coolers 132, 134, and 136. In this embodiment, support 60 has an arrangement of binding sites 62, 64, and 66 each having a liquid 140 that is adapted to engage a liquid engagement surface 88 of a micro-component 80. Coolers 132, 134, and 136 are positioned on support 60 proximate to binding sites 62, 64, and 66. When support 60 is cooled proximate to binding site 62 cooler 132 is cooled which, in turn, causes support 60 proximate to cooler 132 to cool fluid 140. Fluid 140 likewise cools first thermally responsive fluid 72 to form a barrier zone 92 inhibits micro-components 80 from engaging liquid 140.

Figure 5E:
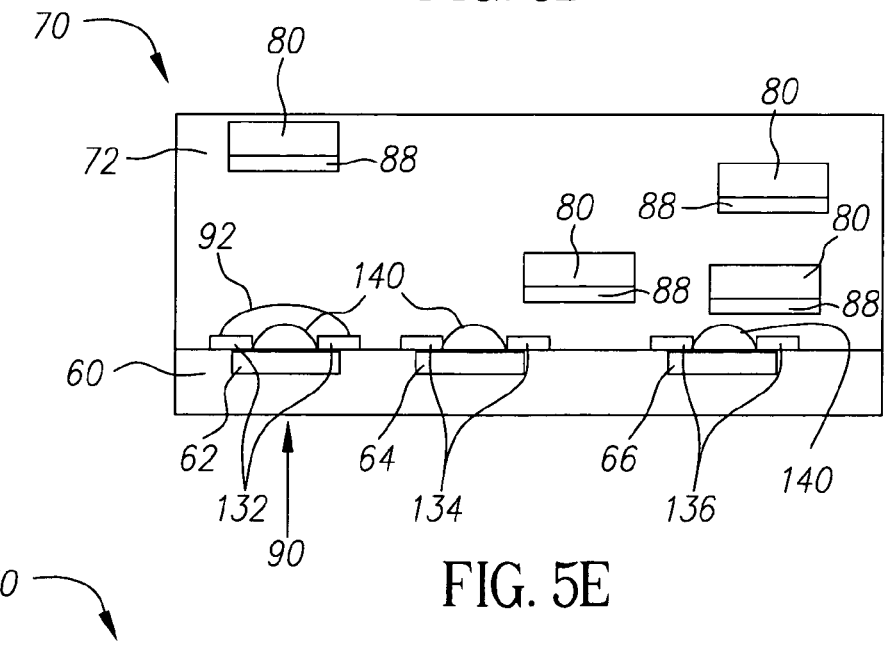

FIG. 5E shows another embodiment wherein support 60 has binding sites 62, 64, and 66 each having a liquid 140 associated therewith to engage a liquid engagement surface 88 of a micro-component 80. As is shown in FIG. 5E, in this embodiment, coolers 132, 134, and 136 are positioned around and proximate to binding sites 62, 64, and 66 in direct contact with binding sites 62, 64, and 66 and directly cool liquid 140.

Figure 5F:
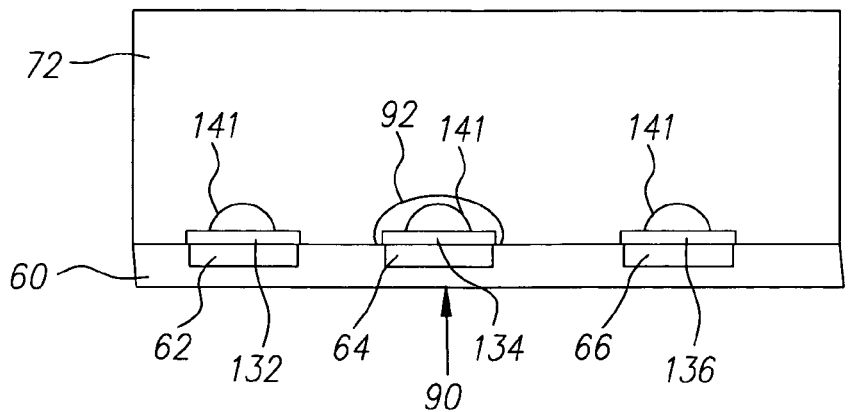
Figure 5G:
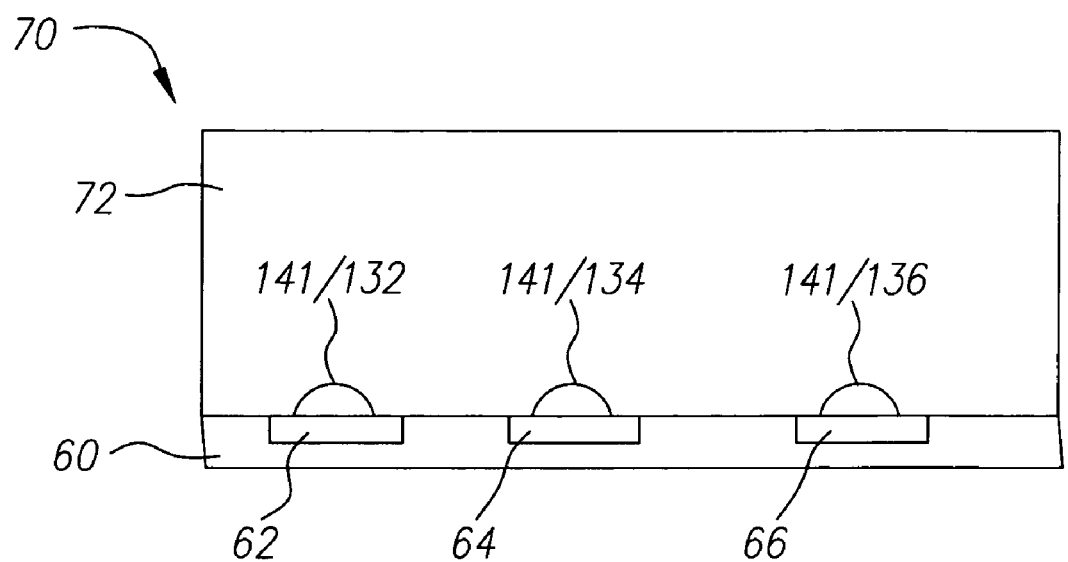

FIG. 5F shows still another embodiment wherein a support 60 is used having binding sites 62, 64, and 66 each having a liquid 140 associated there with and provided to engage in liquid engagement surface 88 of a first micro-component 80. As is shown in FIG. 5F coolers 132, 134, and 136 are positioned at binding sites 62, 64, and 66 respectively and are in direct contact with or immediately proximate to liquid 140. In this embodiment, when any of coolers 132, 134, and 136 are chilled, liquid 140 is cooled to form a barrier zone 92 as described above.

In any of FIG. 5D, 5E or 5F, the coolers can cool liquid 140 so that a barrier zone is formed based at least in part upon the cooling of liquid 140. In still another embodiment shown in FIG. 5G, deposits of liquid 141 operate as a cooler. This can be done by applying a pattern of liquid 141 prior to introduction of thermally responsive fluid 72, with the liquid 141 being cooled, or super cooled, or that will react when applied to the support 60 or to thermally responsive fluid 72 in a manner that provides a cooling effect. In such an embodiment, fluid 141 can be used to comprise cooling material 90.

It will be appreciated that cooling liquid 141, such as acetone or methylene chloride, can be applied patternwise to the surface of a support 60.

It will also be appreciated that cooling material 90 can similarly be applied to support 60 in a fluidic form such as a liquid or gaseous form. For example, a liquid cooling material 90 can be applied to support 60 uniformly or it can be applied in a pattern-wise fashion using among other things printing, drop on demand ink jet technology, masking, continuous ink jet technology, or printing technologies that use super critically cooled carbon dioxide as a solvent to deliver materials such as cooling material 90.

Cooling material 90 can be applied to support 60 before thermally responsive fluid 72 is introduced and when applied in this fashion, cooling material 90 can be applied directly to a side of support 60 having binding sites on support 60 or cooling material 90 can be applied to an opposite side. Where cooling material 90 is applied to support 60 before introduction of thermally responsive fluid 72, cooling material 90, support 60 and or coolers such as coolers 132, and 134 can be provided that ensure that any binding sites that are to be protected by a barrier zone will be cooled in a manner that does not allow the barrier zone to dissipate while a slurry 70 having micro-components is applied to support 60. Coolers 132 and 134 can be specially adapted for such a controlled cooling response.

FIGS. 5H-5L show embodiments wherein support 60 is adapted with binding sites 62, 64, 66, and 68 that are associated with coolers 132, 134, and 136 that have a different thermal response to a uniform application of a cooling material to support 60.

In FIGS. 5H-5L, this difference is used to enable selective micro-assembly at selected binding sites 62, 64, 66 and 68 on support 60. In particular, this efficiency difference causes different ones of coolers 132, 134, and 136 to attain the temperature for forming a barrier zone, while other ones of coolers 132, 134, and 136 do not dissipate heat rapidly enough to attain an appropriate temperature for forming a barrier zone, in response to the application of the same energy. Controlling the characteristics of coolers 132, 134, and 136 enables selecting which binding sites are filled and which form barrier zones to remain empty without specifically cooling some sites, such as by a scanning system or mask, as will be described in greater detail below, thereby allowing uniform energy delivery to all binding sites while providing discrimination.

Figure 5H:
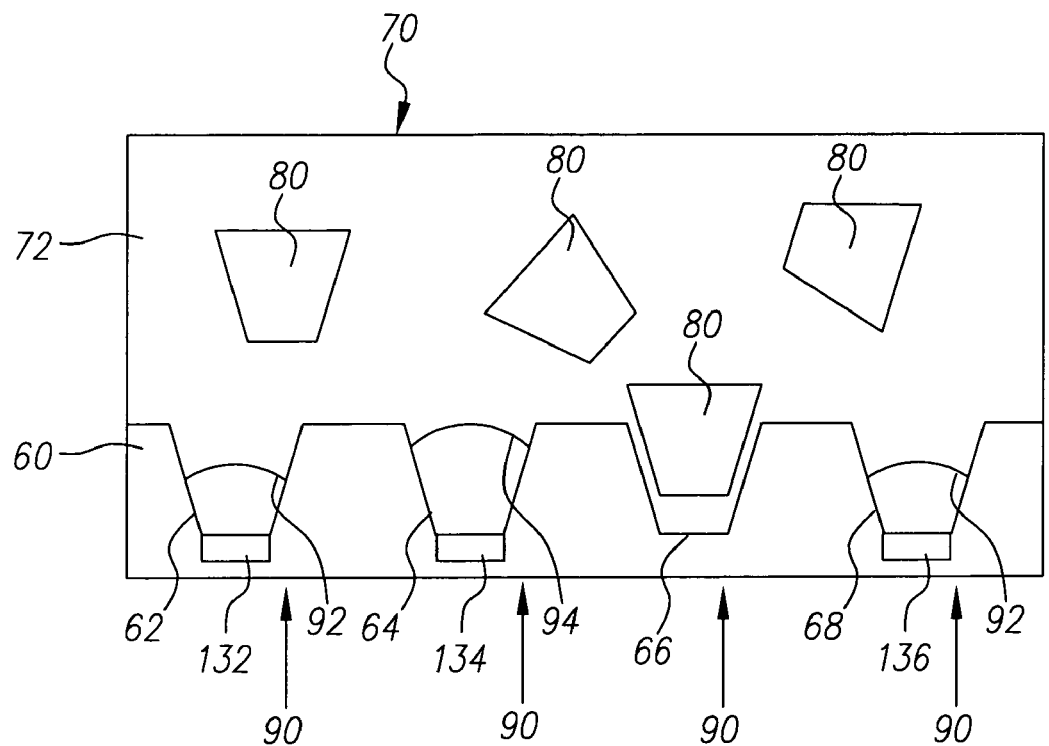
FIGS. 5H-5J show embodiments of the invention wherein a set of different coolers are incorporated into a support proximate to selected binding sites.
Figure 5I:
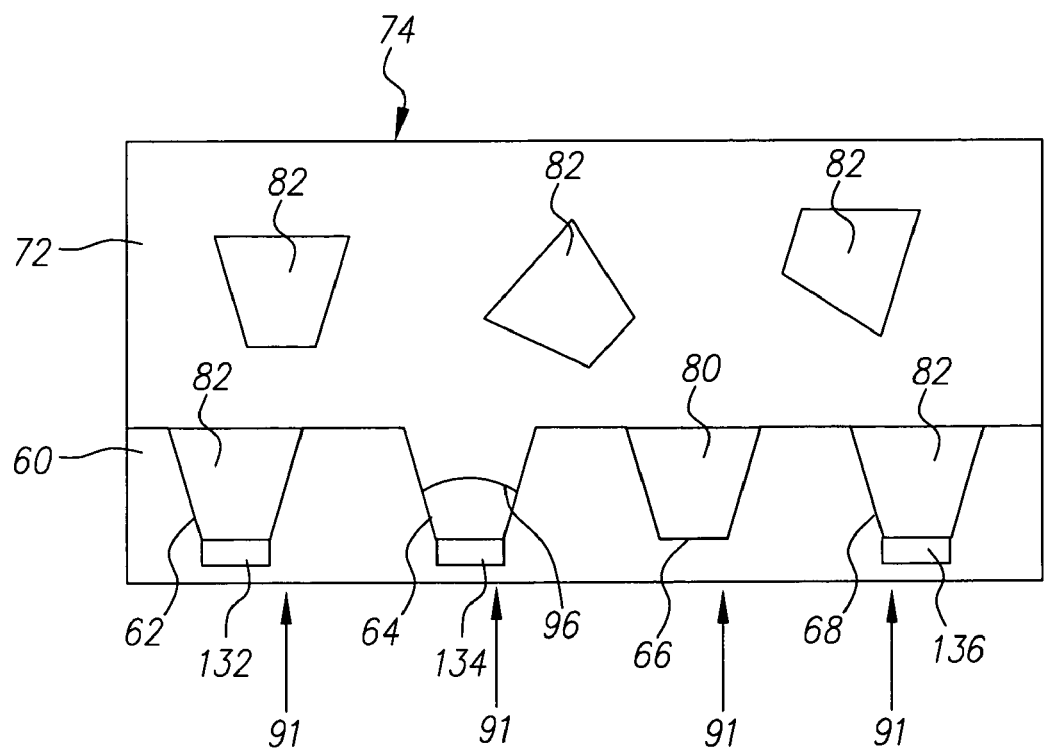
Figure 5J:
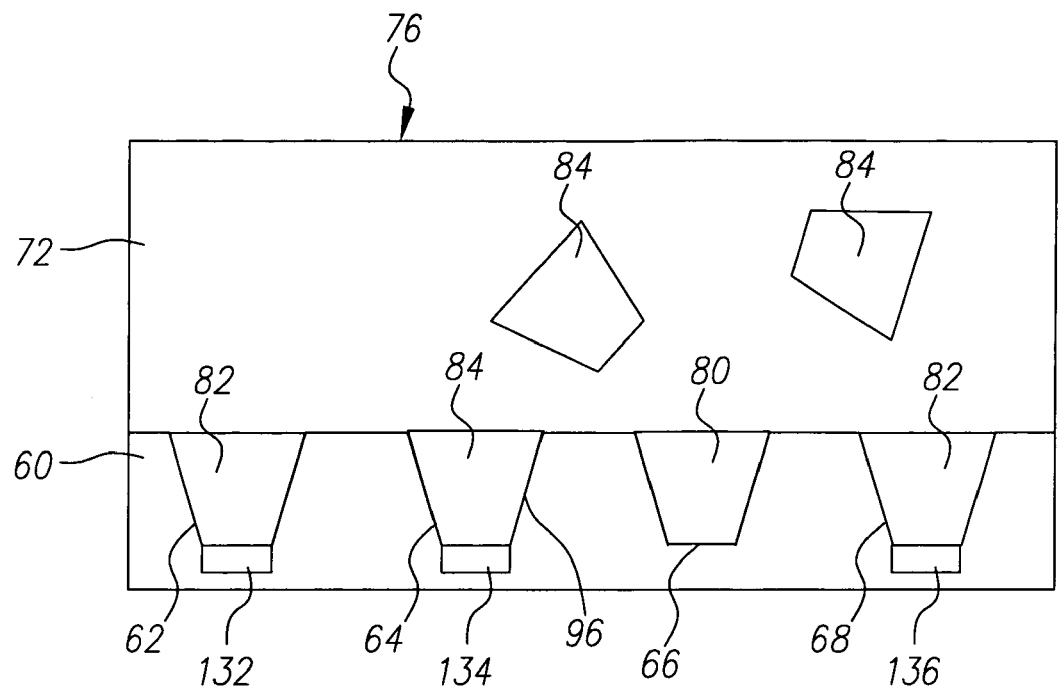

FIGS. 5H, 5I, and 5J illustrate how this can be done. In FIGS. 5H, 5I, and 5J, coolers 134 have a different thermal response when cooled by the application of a cooling material 90 than coolers 132 and 136 have when exposed to the same amount of cooling. FIG. 5H depicts a first step of an assembly process having this arrangement of coolers 132, 134, and 136 on a support 60. As is shown in FIG. 5H, a support 60 is uniformly cooled proximate to binding sites 62, 64, 66, and 68 of support 60 either before or during exposure of support 60 to a first slurry 70 of thermally responsive fluid 72 having first micro-components 80 therein. This cooling, which can be measured as the temporal rate of energy flow from an area of support 60, is established so that less efficient coolers 132 and 136 form barrier zones 92 and 96 and so that the efficient coolers 134 also form barrier zones 94. Accordingly, first type of micro-components 80 engage only binding sites 66 lacking coolers.

FIG. 5I illustrates a second assembly step. In this assembly step, support 60 an exposure to a second cooling material 190 that is adequate for the more efficient coolers 134 to form a barrier zone 96 but that is inadequate for the less efficient coolers 132 and 136 to form barrier zones so that introduction of an intermediate slurry 74 having second or intermediate micro-components 82 therein allows the intermediate type of micro-components 82 to engage binding sites 62 and 68 that correspond to the less efficient coolers 132 and 136.

FIG. 5J illustrates yet another assembly step, such as a final assembly step. In this step, the exposure of support 60 to energy is too low to cause the more efficient coolers 134 to form barrier zones and allows a final slurry comprising final type of micro-component 84 in a carrier fluid 76 to attach to binding sites 64 corresponding to those more efficient coolers 134.

It will be appreciated that, in certain embodiments of the invention, it is not necessary to introduce a second cooling material, and that in such embodiments, the flow of first slurry 70 will be timed to occur during a time when an initial amount of cooling sufficient to cause formation of barrier zones 92, 94, and 98 at binding sites 62, 64 and 66, while the introduction of second slurry 74 can be timed to occur at a time after the cooling supplied by less efficient coolers 132 and 136 has diminished sufficiently to allow barrier zones 92 and 98 to dissipate, at the less efficient coolers 132 and before the cooling supplied by more efficient cooler 134 has diminished sufficiently to allow barrier zone 94 to dissipate. Similarly, in this embodiment, a final slurry can be introduced after the cooling supplied by more efficient cooler 134 has diminished sufficiently to allow barrier zones 94 to dissipate.

Discrimination can be conferred upon binding sites by making at least two types of coolers with differing thermal absorption characteristics or differing thermal release characteristics.

Figure 5K:
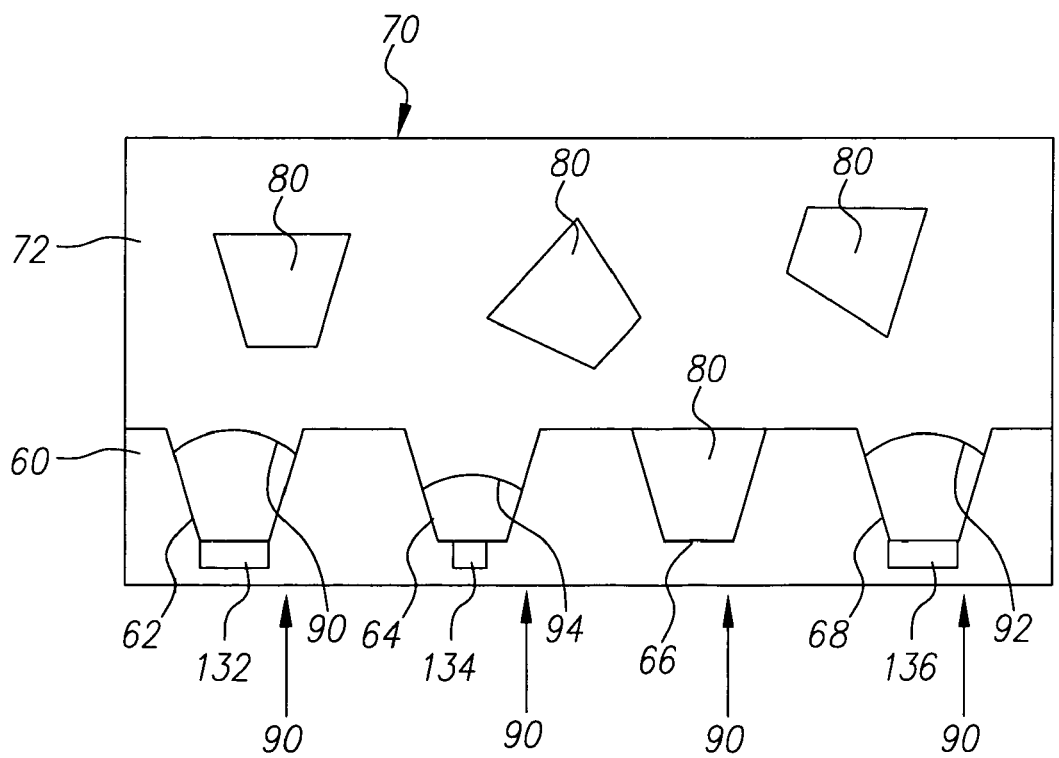
FIGS. 5K-5M illustrate micro-assembly using another embodiment of a support having a set of different coolers.
Figure 5L:
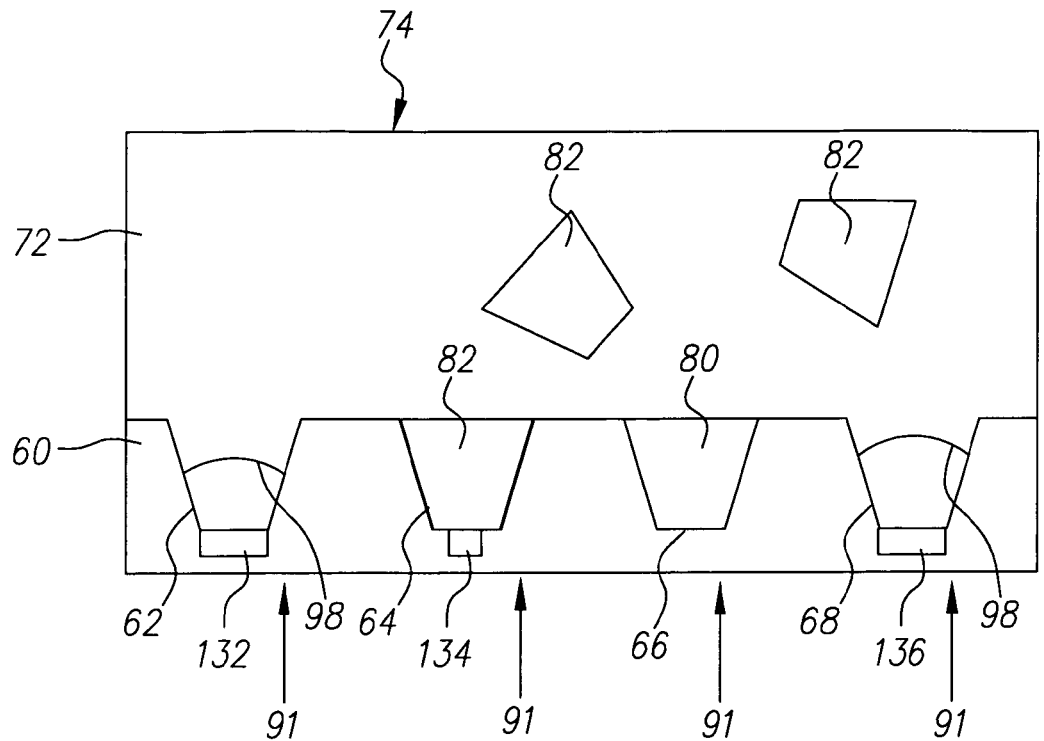
Figure 5M:
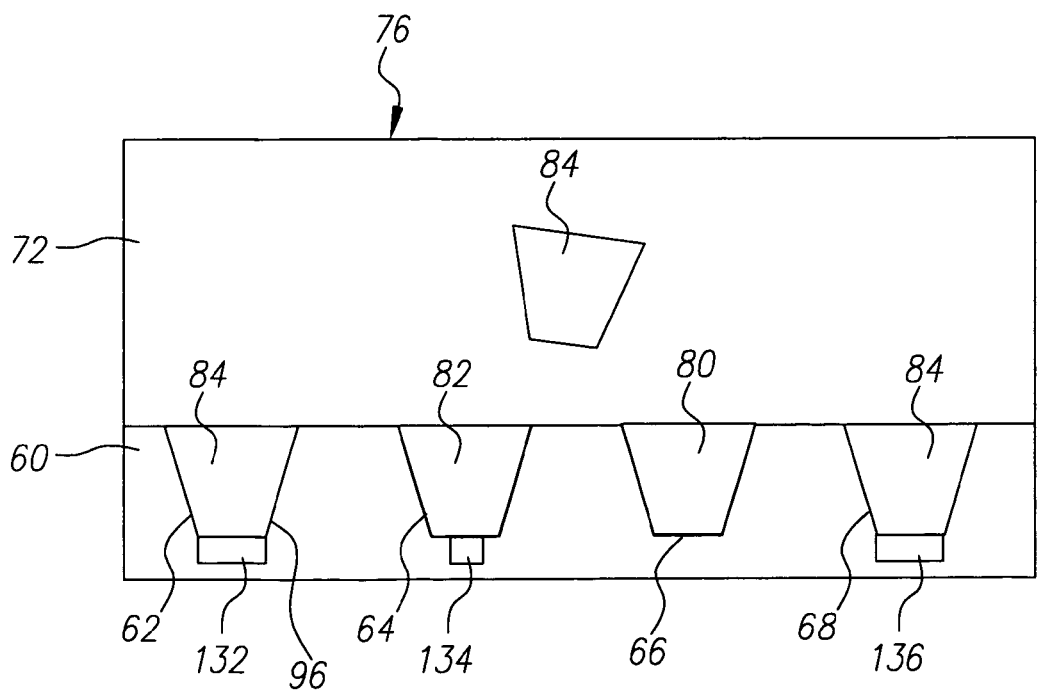

FIGS. 5K-5M depict another embodiment of a support 60 having an arrangement of coolers 132, 134, 136, and 138 that respond to the a uniform cooling in different ways. In this embodiment, coolers 132, 134 and 136 can be provided on support 60 that are formed from a common material having a common thermal response and a common thickness as applied to the support, but can still provide discrimination. This simplifies the production of the coolers and control of the location of their mounting to the support 60.

Specifically, discrimination is accomplished in this embodiment by using an arrangement of coolers having different sizes to selectively control the thermal cooling that cooler 134 can provide as compared to coolers 132 and 136. This limits the rate and/or amount of cooling that can be thermally provided to responsive fluid 72 in a slurry to produce a barrier zone. The spatial distribution of area cooled by coolers 132, 134, and 136 into cooler regions of the slurry determines the profile of reduced temperature areas surrounding each coolers 132, 134, and 136. Sufficient exposure 90 can cause an coolers 132, 134, and 136 to produce a barrier beyond the lateral extent of cooler 132, 134, and 136.

FIGS. 5K-5M show one embodiment of this arrangement of coolers 132, 134 and 136. In the embodiment shown in FIGS. 5K-5M, coolers 132 and 136 are shown that cover substantially all of the bottom surface of binding sites 62 and 68, while cooler 134 covers only a fraction of the lateral extent of coolers 132 and 136. Binding site 66 has no coolers 134. In a first step of an assembly process using support 60 shown in FIG. 5L, a first uniform exposure of energy 90 is provided that is sufficient for smaller cooler 134 to produce a barrier zone 94 of adequate extent to protect its corresponding binding site 64 from attaching a first type micro-component 80 upon introduction of first slurry 70, while the wider coolers 132 and 136 form barrier zones 92 and 96 to protect associated binding sites 62 and 68, so that only binding site 66 with no cooler is filled with first micro-component 82.

FIG. 5L shows support 60 of FIG. 5K exposed to a second slurry 74 having a second type of micro-components 82 therein, with and exposed to a second, lower exposure to cooling material 90 that is adequate for the wider coolers 132 and 136 to form intermediate barrier zones 98. However, the laterally smaller energy absorbing cooler 134 does not provide sufficient cooling to cause a barrier zone to form or may form a barrier zone that is too small to prevent adhesion of the intermediate type of micro-component 84 to binding site 64, so each site associated with a laterally smaller coolers 134 can be filled by the intermediate type of micro-component 84 upon introduction of second slurry 74.

FIG. 5M shows the application of a final slurry 76 having final micro-components 84 applied to support 60, while support 60 is not exposed to energy or is exposed to a level of energy (not shown) that is insufficient for any cooler to produce a barrier zone. This allows each binding sites 62 and 68 associated with the widest coolers 132 and 136 to receive final micro-component 86 upon introduction of final slurry 76.

Figure 6A:
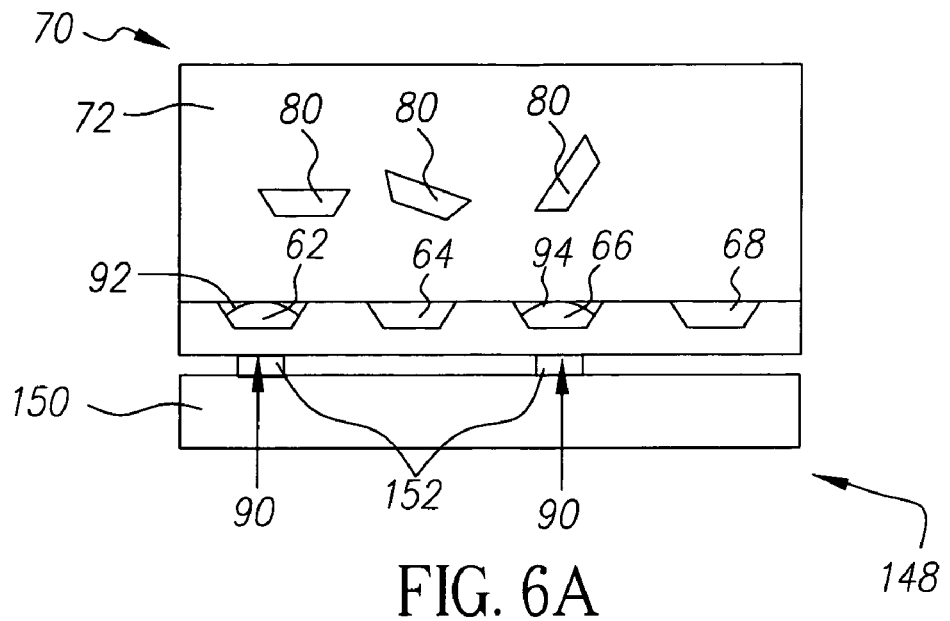
FIGS. 6A-6D illustrate various other embodiments of the invention wherein energy is selectively applied to cause localized cooling of a carrier fluid.

FIGS. 6A-6D illustrate various other embodiments of the invention wherein energy as is selectively applied to cause localized cooling of a thermally responsive fluid 72. As is shown in FIG. 6A, a support 60 is provided having binding sites 62, 64, 66, and 68. In this embodiment, support 60 is cooled by applying a cooling material in solid form such as using a contact cooler 148 comprising a patterned cooling block 150 with projections 152 in contact with support 60 proximate to selected binding sites 62 and 66. Projections 152 of patterned cooling block 150 selectively cool support 60 proximate to binding sites 62 and 66 to enable the formation of barrier zones 92 and 94 as described above.

Figure 6B:
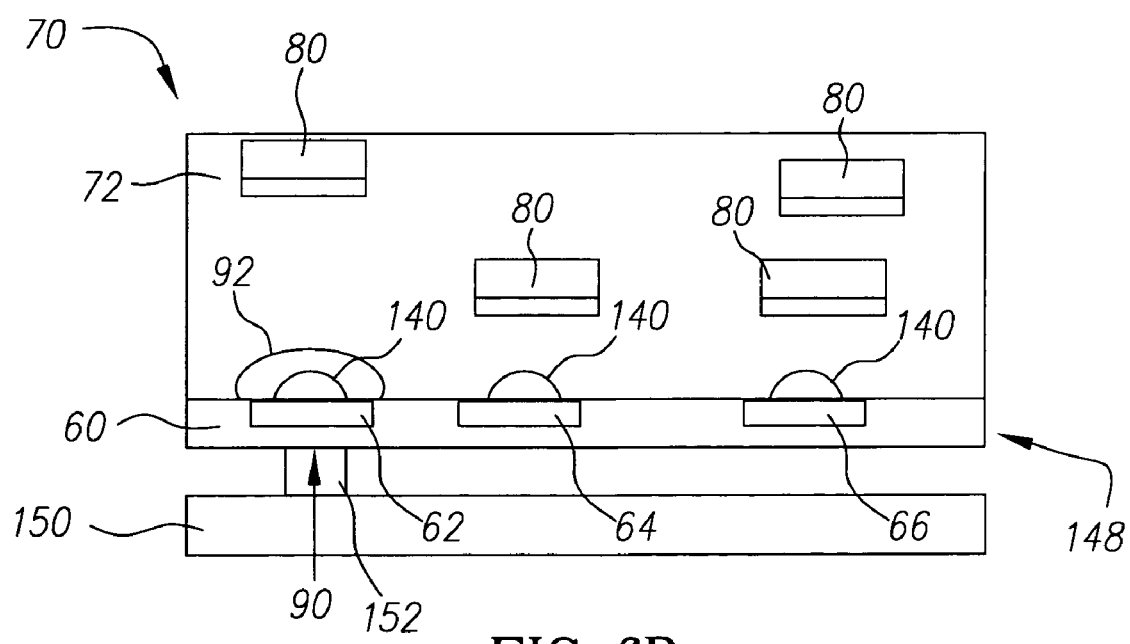

FIG. 6B illustrates the cooling of a selected binding site 62 using contact cooler 148 comprising a patterned cooling block 150 with projections 152 to cool a support 60 having binding sites 62, 64, and 66 each associated with a liquid 140.

It will be appreciated that such a contact cooler 148 can take many forms. For example, a cooling block 150 of the type shown in FIGS. 6A and 6B take the form of a platen, roll, or other cooled surface having projections 152 in the form of raised areas adapted to contact support 60 and to cool support 60 using a fixed pattern of projections 152.

Figure 6C:
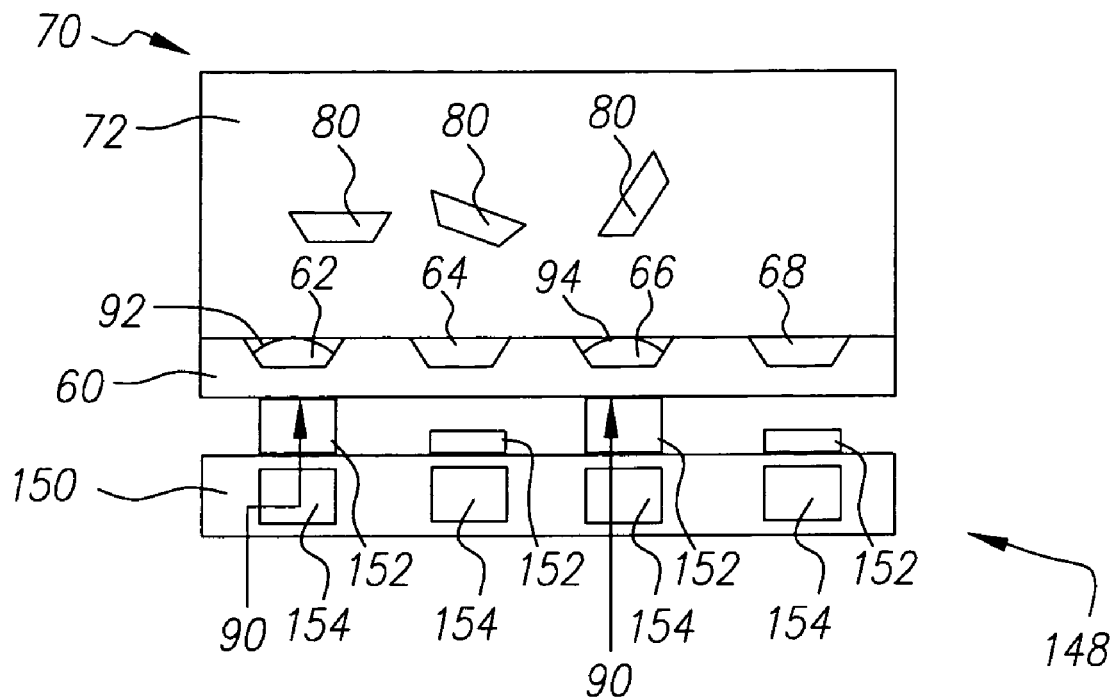

FIG. 6C shows a different embodiment of a cooling block 150 having projections 152 in contact with support 60 and proximate to binding sites 62 and 66. In this embodiment, projections 152 have selectably addressable actuators 154 that bring projections 152 into and out of contact with support 60 on demand. In this way, during multiple assembly cycles, support 60 can be cooled in a pattern that is dynamically adjusted without moving either block 150 or support 60. In the embodiment shown, projections 152 have selectively addressable actuators such as electrically actuatable micromotors or piezoelectric actuators that can selectively bring projections 152 into or out of contact with support 60 on demand.

Figure 6D:
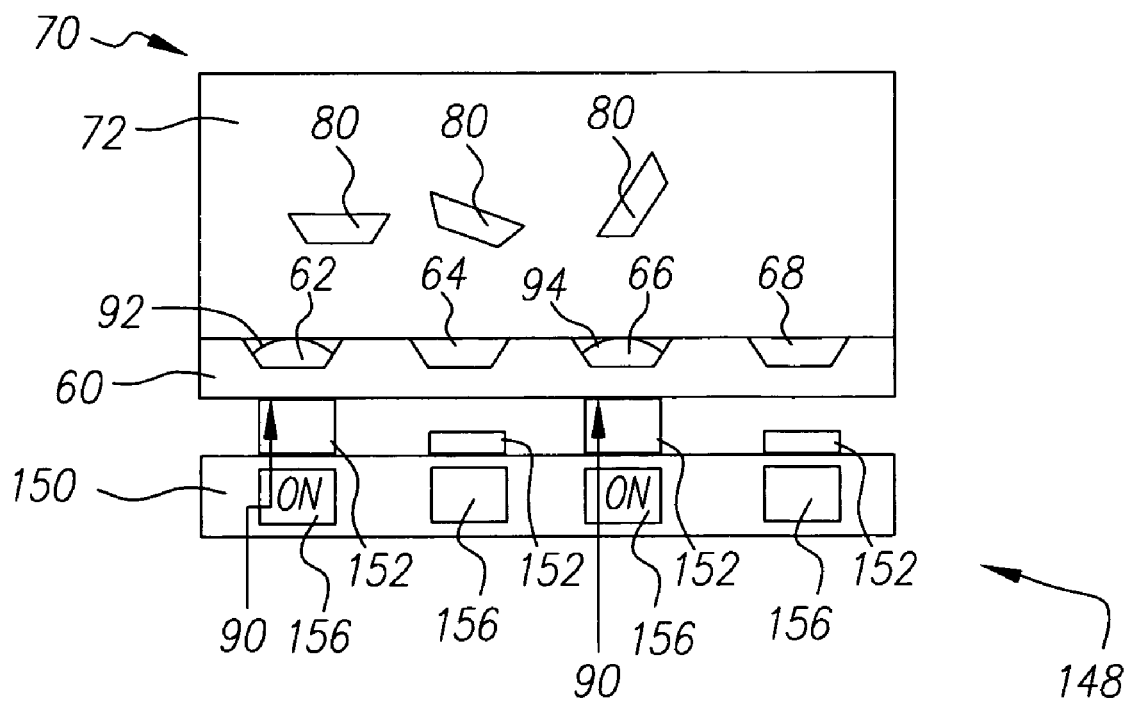

FIG. 6D illustrates the cooling of selected sites using a cooling block 150 having projections 152. In this embodiment, projections 152 are adapted to incorporate a selectively actuatable cooler 156 so as to permit dynamic adjustment of the pattern of cooled areas on support 60.

Figure 7:
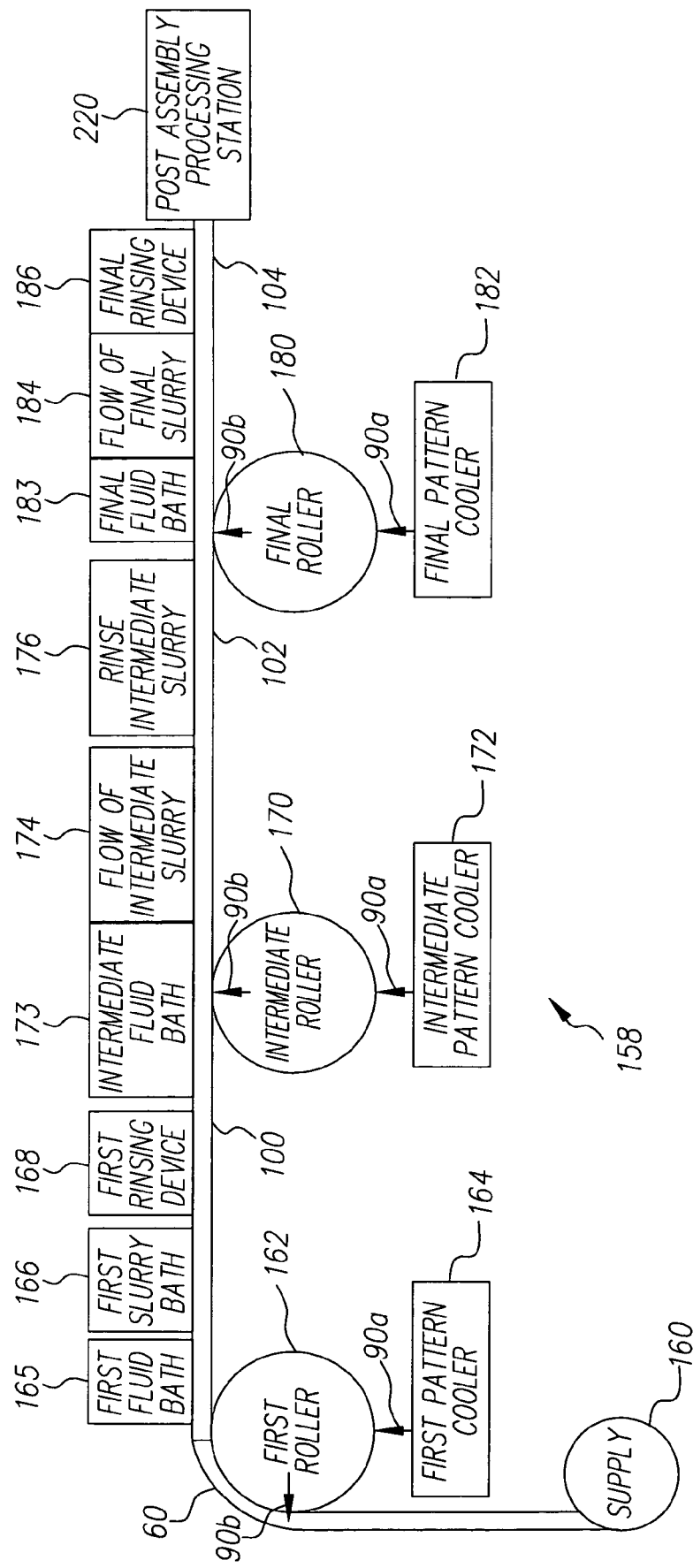
FIG. 7 shows an embodiment of an apparatus for assembling a micro-assembled structure in which portions of a support are selectively cooled and thereby cool a thermally responsive fluid having micro-components therein in order to permit selective assembly.

FIG. 7 shows an embodiment of an apparatus 158 for assembling a structure in which cooling can be applied selectively to support 60 and thereby to a thermally responsive fluid 72 in order to allow the formation of barrier zones to permit selective assembly as described above. FIG. 7 also shows using a web based continuous manufacturing process suitable for high-volume production. In this embodiment, a supply 160 provides a continuous web of support 60 having an arrangement of binding sites (not shown) thereon. The web of support 60 is passed across a first roller 162. First roller 162 is a thermal transfer roller and capable of cooling selected areas of support 60 when in contact. In this regard, first roller 162 is adapted to be selectively cooled by a first pattern cooler 164 such as a Peltier type cooler or other source of cooling that can provide a desired pattern of chilled areas on first roller 162. In operation, first pattern cooler 164 supplies a pattern of energy 90a to first roller 162 as first roller 162 rotates. When web of support 60 engages first roller 162, a corresponding pattern of cool 90b is transferred from first roller 162 to web of support 60.

After support 60 has been cooled, support 60 is passed through a first bath 165. First bath 165 contains thermally responsive fluid 72. As thermally responsive fluid 72 is cooled by support 60, barrier zones are formed as described above. Support 60 with certain sites blocked by the barrier zones is passed through a first slurry bath 166. Alternatively, support 60 can be cooled as it is passed through first bath 165 as described above.

First slurry bath 166 contains a first slurry 70 having micro-components, such as first micro-components 80, within carrier fluid 73 such as thermally responsive fluid 72. The barrier zones inhibit the first micro-components 80 from engaging selected binding sites. Micro-components 80 engage binding sites not protected by barrier zones to form a micro-assembled structure 100. As support 60 continues to move through the system 158 shown in FIG. 7, support 60 passes through a rinsing device 168 that removes residual amounts of first slurry 70 from support 60.

The web of support 60 then passes over at least one intermediate roller 170. In the embodiment shown, intermediate roller 170 comprises another thermal transfer roller that is adapted to receive chilled pattern areas 90a from an intermediate pattern cooler 172 and to selectively cool web of support 60. After support 60 has been cooled support 60 is passed through an intermediate slurry bath 174. Intermediate slurry bath 174 has a carrier fluid 73, comprising in this embodiment, a thermally responsive fluid 72 containing intermediate type micro-components 82. Intermediate micro-components 84 are then permitted engage binding sites on micro-assembled structure 100 to form an intermediate micro-assembled structure 102. The type of thermally responsive fluid 72 used in the intermediate slurry bath 174 can be the same as or can be different than the type of thermally responsive fluid used in carrier fluid that is used in the first slurry bath 166.

As thermally responsive fluid 72 cooled by support 60, barrier zones are formed as described above. These barrier zones inhibit intermediate micro-components 84 from engaging selected binding sites. Micro-components 84 engage binding sites not protected by barrier zones to form a micro-assembled structure 100. As support 60 continues to move through the system 158 shown in FIG. 7, support 60 passes through an intermediate rinsing device 176 that removes residual amounts of the first slurry from support 60.

Web of support 60 then passes over final roller 180. In the embodiment shown, final roller 180 comprises another thermal transfer roller that is adapted to receive chilled pattern areas 90a from a final pattern cooler 182 and to selectively cool web of support 60. After support 60 has been cooled by final roller 180, web of support 60 is passed through an final slurry bath 184. Final slurry bath 184 contains at least one final type of micro-component 86 within a carrier fluid 73 such as thermally responsive fluid 72. It will be appreciated however that the thermally responsive fluid 72 can be used in the intermediate slurry bath 184 can be the same as or can be different than the carrier fluid that is used in the first slurry bath 166 or in the second slurry bath 174.

As thermally responsive fluid 72 is cooled by support 60, barrier zones are formed as described above. These barrier zones inhibit the final type micro-components 86 from engaging selected binding sites. Micro-components 84 engage binding sites not protected by barrier zones to form a final micro-assembled structure 104. As support 60 continues to move through the system 158 shown in FIG. 7, support 60 passes through a final rinsing device 186 that removes residual amounts of the first slurry from final micro-assembled structure 104. Support 60 and final micro-assembled structure 104 then pass to a post-assembly processing station 220 wherein support 60 and micro-assembled structure 104 are further processed for use, for example, by separating support 60 from micro-assembled structure 104 or by otherwise packaging or processing final micro-assembled structure 104.

It will be appreciated that once a pattern of energy is transferred to support 60, "cool spots" are formed on support 60 that have a finite lifetime because they are heated by their surroundings. A cool spot is heated at a rate that depends primarily on the temperature difference between the cool spot and its surroundings including the thermally responsive fluid 72. In order to prolong the lifetime of a hot spot, a thermally responsive fluid 72 may be advantageously supplied at a temperature slightly above a transition temperature at which the viscosity of the thermally responsive carrier fluid 72 undergoes meaningful change or transition of viscosity, such as a transition temperature at which thermally responsive carrier fluid 72 transitions from a liquid to a gel so as to minimize the amount of cooling required to form a barrier zone 92 while at the same time reducing the temperature difference between the chilled spot and its surroundings.

Figure 8A:
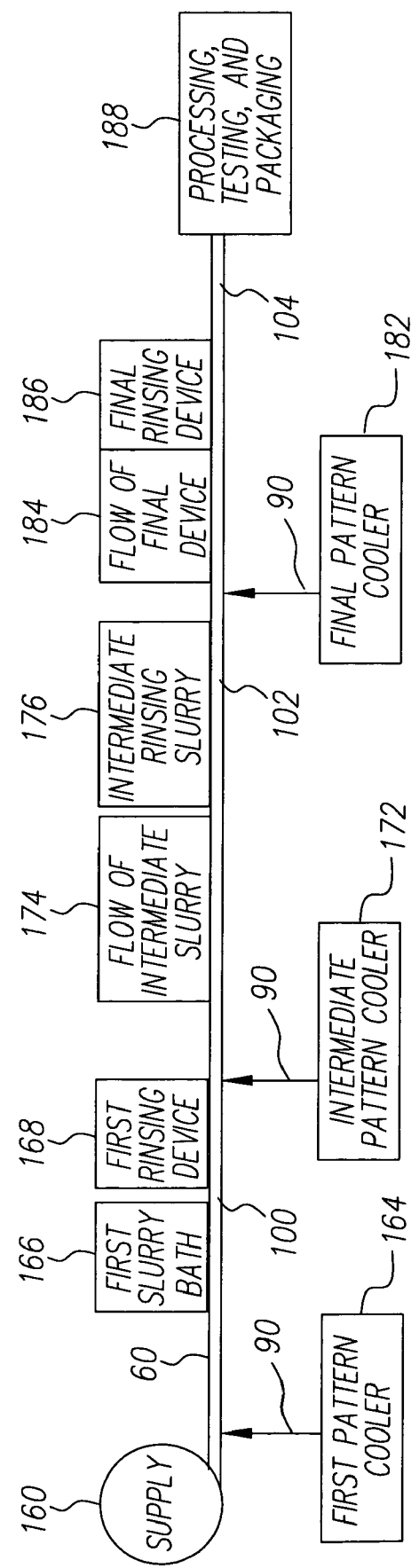
FIG. 8A shows an embodiment of an apparatus for assembling a micro-assembled structure in which portions of a support are selectively cooled and thereby cool a thermally responsive fluid having micro-components therein in order to permit selective assembly.
Figure 8B:
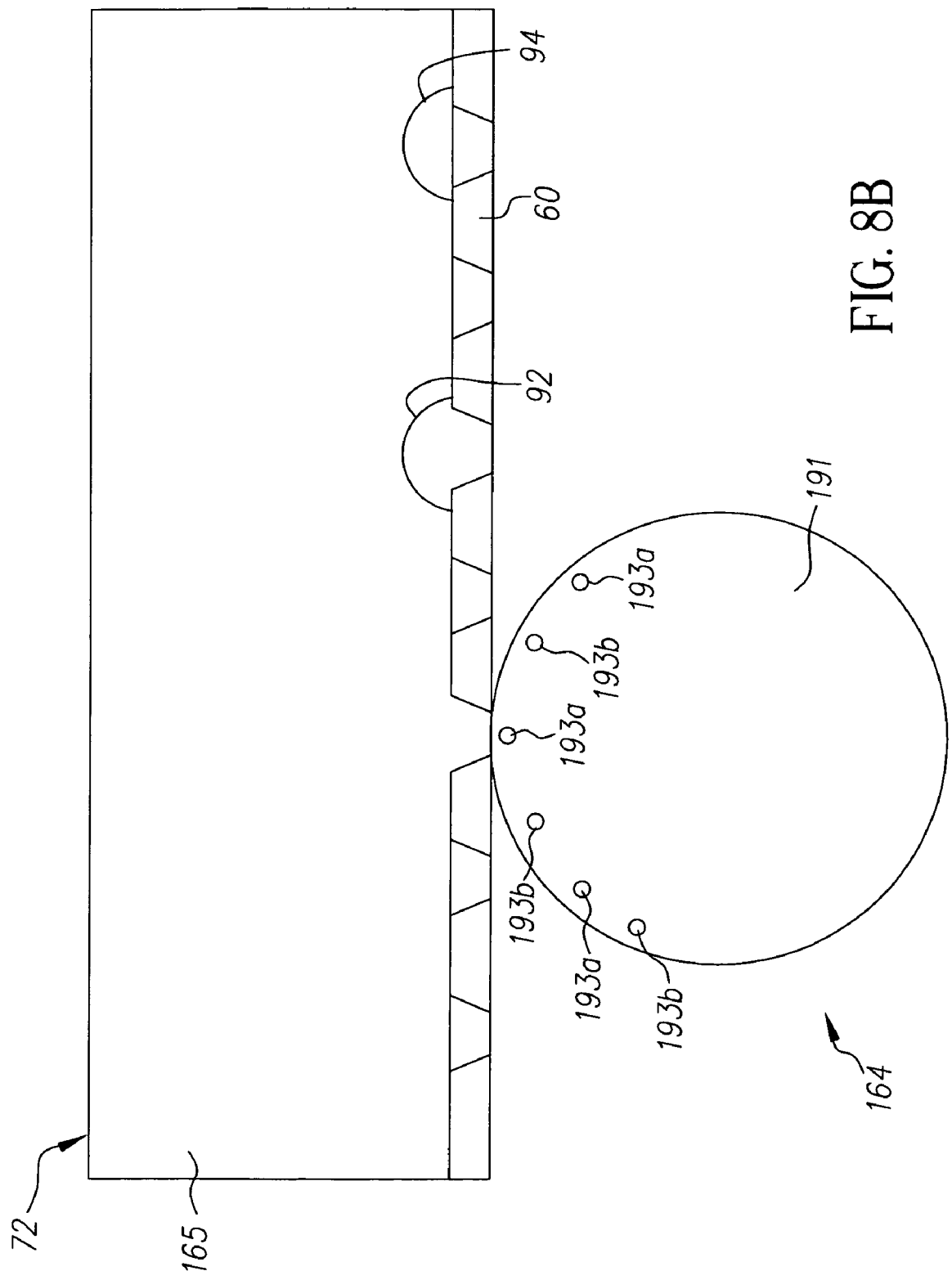
FIG. 8B shows an embodiment of a patterned cooler adapted to selectively cool a support.

Another embodiment that selectively cools a support 60 to form barrier zones corresponding to selected binding sites on a support, is shown in FIGS. 8A-8B. As is shown in FIG. 8A, in this embodiment a continuous process is provided that does not include thermal transfer rollers 162, 170 and 180. Instead, in this embodiment, first pattern cooler 164, intermediate pattern cooler 172, and final pattern cooler 182 are adapted to directly cool support. As is also shown in FIG. 8A, in this embodiment, intermediate pattern cooler 172 is shown directly cooling a support 60 so that a thermally responsive fluid 72 contained in intermediate slurry can form desired barrier zones.

Alternatively, any of the patterned coolers 164, 172, or 182 can also comprise an array of electrically addressable cooling elements. For example, a typical array of electrically addressable cooling elements for use in the method of the present invention contains a plurality of adjacent, microscopic Peltier type cooling elements, which convert electrical energy via a joule effect into a cooling effect. Such thermal heads can be used in contact or, in close proximity with support 60 so as to transfer heat from support 60 to cool support 60 in a pattern-wise fashion as support 60 passes across a thermal transfer roller such as first roller 162, intermediate roller 170, or final roller 180.

FIG. 8B shows one embodiment of pattern cooler such as first pattern cooler 164 comprising a roller 191 that is adapted to directly cool support 60. As is shown in FIG. 8B, in this embodiment, roller 191 is adapted with a pattern of selectively addressable coolers 193a and 193b such as Peltier type cooling elements positioned near a surface 195 of roller 191. Surface 155 of roller 191 contacts support 60 before or as support 60 passes through first fluid bath 165. In the embodiment shown, coolers 193a are active and produce cool support 60 while coolers 193b are interactive and do not cool support 60. Accordingly, as support 60 is passed into first fluid bath 165, thermally responsive fluid 72 in first fluid bath 165 areas of support 60 that were cooled form barrier zones as described above, while in other areas, no barrier zones are formed.

Figure 9:
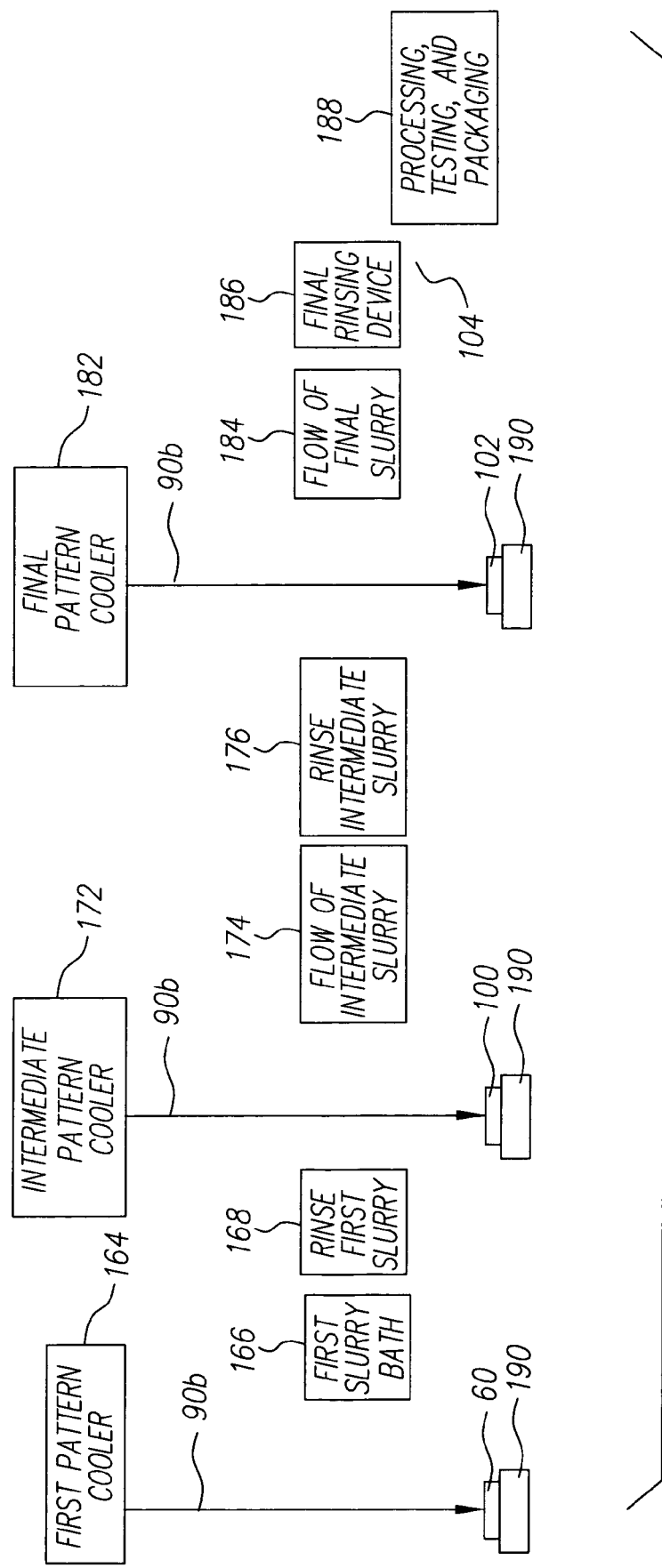
FIG. 9 shows an embodiment of an apparatus for assembling a micro-assembled structure in which cooling can be applied selectively to support and thereby to a thermally responsive fluid having micro-components therein in order to permit selective assembly.

In still other embodiments, any of pattern coolers 164, 172, and 182 can be provided across a path of movement comprise a linear array cooler elements disposed across a pathway used by support 60 such as an array of Peltier type coolers, or another array of coolers. It will be appreciated that the methods described with respect FIGS. 7 and 8A-8B can also be performed in a non-continuous process. For example, as is shown in FIG. 9, individual sheets of sections of support 60 can be provided on platen 190 that are passed through system 158 in a sequential or non-sequential process. Platens 190 can comprise any rigid or flexible structure that can hold and position a support 60 during micro-assembly. Platens 190 can be moved by a conveyor system or can be self-propelled and/or self-guiding. In the embodiment shown, energy is applied to support 60, micro-assembled structure 100, and at least one intermediate micro-assembled structure 102, by way of a pattern cooler that directly cools the top surface 192, 194 and 196 respectively.

Figure 10:
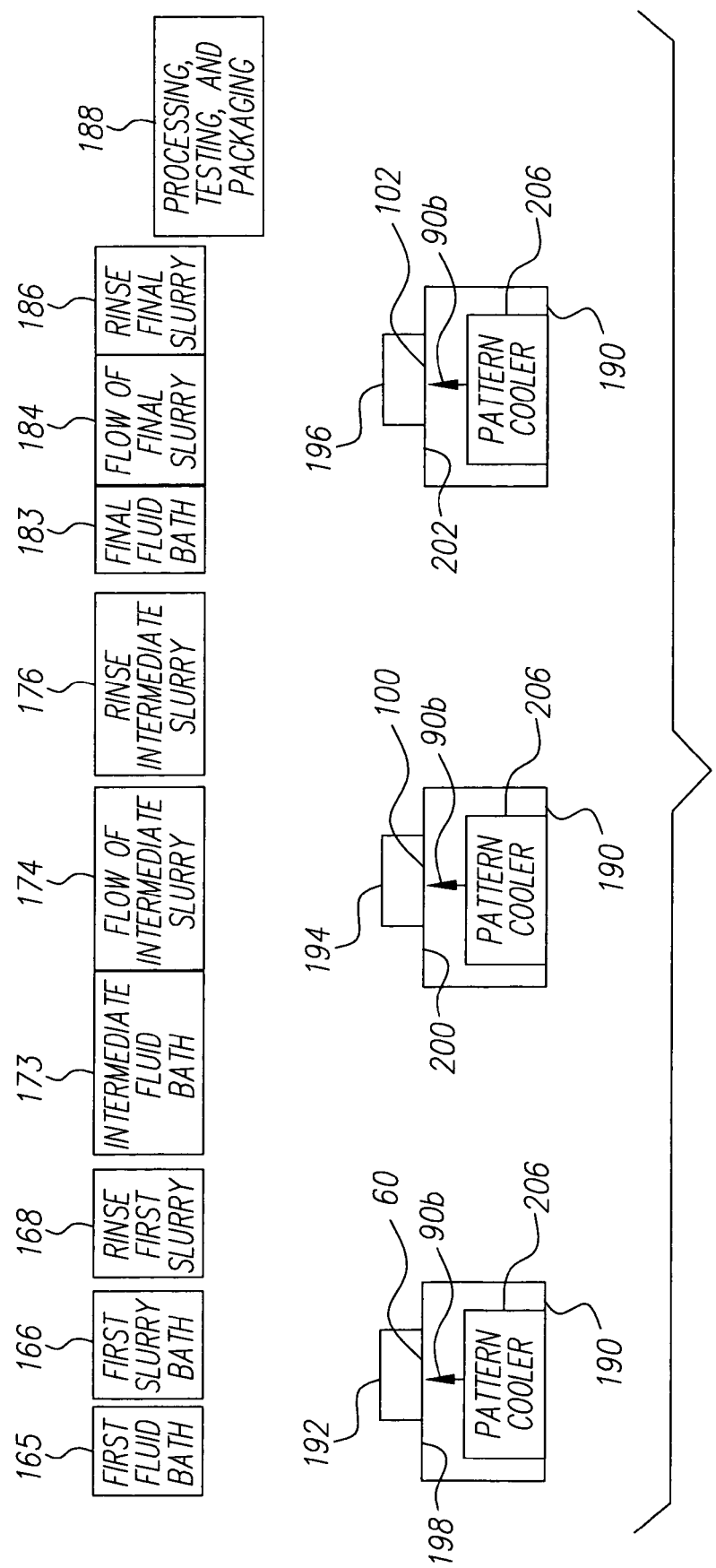
FIG. 10 shows an embodiment of an apparatus for assembling a micro-assembled structure in which cooling can be applied selectively to support and thereby to a thermally responsive fluid having micro-components therein in order to permit selective assembly.

However, in another embodiment shown in FIG. 10, platens 190 can be adapted with a patterned contact cooler 206 that applies different amounts of cooling to support 60, micro-assembled structure 100, and at least one intermediate micro-assembled structure 102, to cool a back surface 198, 200 or 202 respectively which then cools thermally responsive fluid to form barrier zones as described above when exposed to a thermally responsive fluid to allow the formation of selected arrangements of barrier zones.

In another embodiment, individual sheets of support 60 can be passed through any of the above-described embodiments of an apparatus 158 for forming a micro-assembled structure without platens 190. For example, the individual sheets can be passed through apparatus 158 using any known conveyor system including but not limited to a belt drum or other conveying system.

Figure 11A:
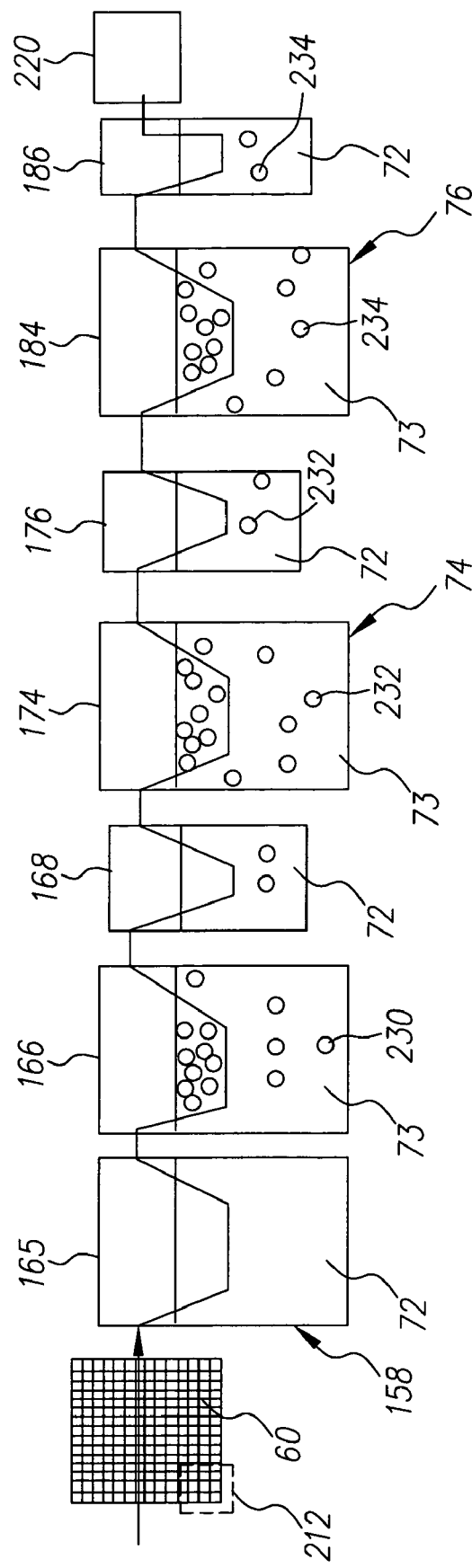

FIGS. 11A-11H illustrate the application of one embodiment of an apparatus 158 for forming a color display having color display elements comprising, in this embodiment, a combination of red, green, and blue colored electrophoretic beads or bichromic beads. FIG. 11A illustrates the movement of a support 60 through micro assembly process while FIG. 11B illustrates a top down view of a section 212 of support 60 before the assembly of the support 60 and micro-components 80-84. FIG. 11C illustrates a top down view of a section 212 of support 60 after a first processing step.

Referring to FIG. 11A, in a first step of the assembly process, support 60 is passed through a first fluid bath 165 containing a thermally responsive fluid. A pattern cooler (not shown) applies a pattern of energy proximate to each of the green micro-cup sites 216, and blue micro-cup sites 218. This causes the formation of a pattern of barrier zones 92 and 94 proximate to the green micro-cup sites 216 and blue micro cup sites 218 as seen on FIG. 11C.

A first slurry bath 166 applies a first slurry 70 of carrier fluid 73 having red micro-beads 230 to support 60. When the first slurry 166 is applied, red micro-beads 230 bind to red micro-cup sites 214. FIG. 11D shows a top view of a completed first micro-assembled structure 100 having an array of red micro-beads 230 filling each of micro-cup sites 214.

In this way a first micro-assembled structure 100 is formed. Micro-assembled structure 100 is then rinsed in rinse 168 to remove any residual unbound red micro-beads 230. The energy that allowed the formation of barrier zones 92 and 94 is then removed or allowed to dissipate so that other barrier zones can be subsequently applied to first micro-assembled structure 100.

In the embodiment shown, after red micro-beads 230 are removed from first micro-assembled structure 100, a new pattern of chilled areas formed on first micro-assembled structure 100 and first micro-assembled structure 100 is exposed in an intermediate slurry bath 174 having, in this embodiment, intermediate micro-components comprising green micro-beads 232 in a thermally responsive fluid 72 causing the formation of intermediate barrier zones 96 proximate to blue micro-cup sites 218 as is shown on FIG. 11D.

Green micro-beads 232 are barred from engaging red micro-cup sites 214 because red micro-cup sites 214 are occupied by red micro-beads 230 and are also barred from engaging blue micro cups 218 because blue micro-cup sites 218 are shielded by barrier zones 96. Accordingly, as is shown in FIGS. 11E, 11F and 11G, while intermediate slurry 74 is applied to first micro-assembled structure 100 and barrier zones 96, green micro-beads 232 engage green micro-bead cup sites 216 to form a pattern of green micro-beads on support 60 to yield an intermediate micro-assembled structure 102 shown in section 212 in FIG. 11G.

As is also shown in FIG. 11G, after assembly intermediate micro-assembled structure 102 is then rinsed by intermediate rinser 176 to remove any unbound green micro-beads 232. During the rinse the intermediate barrier zones 96 are preserved so that unbound green microbeads 232 do not engage blue micro-cup sites 218 during the rinse. The pattern of chilled areas formed on support 60 is removed or allowed to dissipate so that barrier zones 96 can to dissipate enabling binding sites blue micro-cup sites 218 to receive blue micro-beads 234.

A final slurry bath 184 applies a final slurry 76 having blue micro-beads 234 and a carrier fluid 73 to intermediate micro-assembled structure 102. Blue micro-beads 234 are blocked from engaging red micro-cup sites 212, and green micro cup sites 214 as they are occupied by, respectively, red micro-beads 230 and green micro-beads 232. Accordingly, as is shown in FIG. 11H, pattern of blue micro-beads 234 engage remaining unoccupied micro-cup sites, blue micro-cup sites 218 to form a pattern of blue micro-beads 234 on support 60 thus, a final micro-assembled structure 104 is formed. Final micro-assembled structure 104 is then rinsed to remove any residual unbound blue micro-beads 234 and then submitted for post-processing 220 which can includes step such as drying, binding, laminating, or assembling final micro-assembled structure well for use as an integrated display component.

Figure 12:
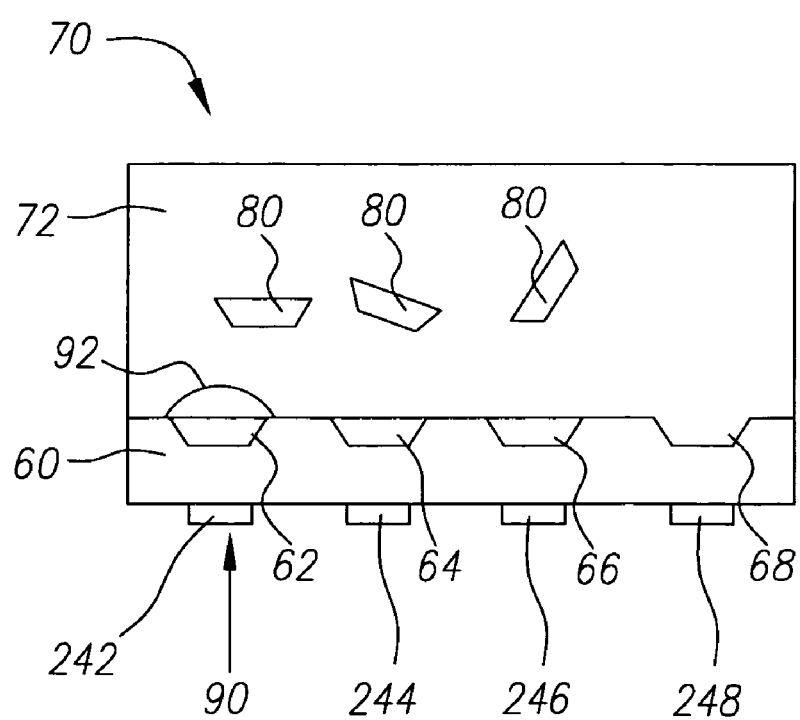
FIG. 12 illustrates the assembly of a first type of micro-component to a support to form a first micro-assembled structure.

In any embodiment of the invention, cooling of a thermally responsive fluid can be performed at any time before or during an assembly process and/or before or during a rinsing process so long as the cooling is performed under circumstances that will allow the formation of barrier zones while there is a meaningful risk that micro-components will be positioned to engage the binding sites. Thus, for example in the embodiment of FIG. 12, where a first slurry 70 is applied that has a carrier fluid 73 comprising a thermally responsive fluid 72 and first type of micro-components 80, the step of applying a thermally responsive fluid to the support (step 105) can be omitted. This is because, in this embodiment, support 60 is selectively cooled (step 107) before first slurry 70 is applied (step 108). This allows barrier zones to form before there is a meaningful risk that first micro-components 80 will bind to the selected binding sites. In this way, steps 113 and 118 can also be integrated with steps 115 and 120 respectively, so as to shorten the intermediate assembly and final processes.

In various illustrations shown above, barrier zones 92, 94 and 96 have been shown having shapes defined for illustrative purposes and these shapes are not limiting. It is sufficient that a barrier zone provide only the minimum resistance to the binding of micro-components to a selected binding site to inhibit such binding. For example, in certain embodiments, a partial blockage of a binding site can be sufficient. In another example, where ligands or other biological binding sites are used, it can be sufficient merely to block or mask the receptor sites of the ligand.

Further, in the embodiments illustrated above, barrier zones have been shown as being provided only for open binding sites that do not have micro-components bound thereto. This too is not limiting and the invention can be practiced in a manner that allows the formation of barrier zones proximate to binding sites that are occupied by micro-components.

This can be done, for example, to protect such micro-components from damage during subsequent assembly steps.

It will further be appreciated that the terms cool, cooling and selectively cooling as used in the present invention are relative measures of a temperature gradient that exists on the support 60. In this regard areas that are described as being cooled in accordance with the method herein can be provided by applying heat other areas of the support, so that the selected areas for cooling will be cool relative to the elevated temperatures of other portions of the support.

The invention has been described in detail with particular reference to certain preferred embodiments thereof, but it will be understood that variations and modifications can be effected within the spirit and scope of the invention.

PART LIST 10 substrate
20 binding sites
22 binding site
24 binding site
25 binding site
26 binding site
27 electrodes
28 binding site
29 fluid
32 cool responsive carrier fluid
34 liquid
36 surface
40 first type of micro-components
42 second type of micro-components
47 micro-components 48 hydrophobic surfaces
49 micro-components
51 micro-component
52 micro-component
60 support
62 binding site
64 binding site
66 binding site
68 binding site
70 first slurry
72 thermally responsive fluid
73 carrier fluid
74 intermediate slurry
76 final slurry
80 first type of micro-component
82 intermediate type of micro-component
84 intermediate type of micro-component
86 final type of micro-component
88 liquid engagement surface
90 cooling material
90a pattern of chilled areas
91 cooling member
92 barrier zone
94 barrier zone
98 barrier zone
100 micro-assembled structure
102 intermediate assembled structure
104 final micro-assembled structure
105 provide support step
106 provide carrier fluid step
107 cool carrier fluid step
108 apply first slurry step
109 remove first slurry step
110 discontinue cooling step
111 further assembly determining step
112 last assembly determining step
113 apply thermally responsive fluid step
114 cool thermally responsive fluid step
115 applied final slurry step
116 remove thermally responsive fluid step
117 discontinue cooling step
118 apply thermally responsive fluid step
119 cool step
120 apply intermediate slurry step
121 remove intermediate slurry step
122 discontinue cooling step
132 cooler
134 cooler
136 cooler
138 cooler
140 liquid
141 liquid cooler
142 cooler
143 inductor
144 capacitor
145 inductor
146 cooler
147 capacitor
148 contact cooler
150 cooling block
152 projections
154 selectively addressable actuators
156 selectively actuatable cooler
158 apparatus for assembling a micro-assembled structure
160 supply
162 first roller
164 first pattern cooler
165 first bath containing thermally responsive carrier liquid
166 first slurry bath
168 rinsing device
170 intermediate roller
172 intermediate pattern cooler
174 intermediate slurry bath
176 intermediate rinsing device
180 final roller
182 final pattern cooler
183a, b, c laser thermal printhead
184 final slurry bath
185a, b, c channels
186 final rinsing device
188 post-assembly processing station
190 platen
191 roller
192 top surface of platen
139a cooler
193b cooler
194 top surface of platen
196 top surface of platen
198 back surface of platen
200 back surface of platen
202 back surface of platen
206 pattern contact cooler
210 micro-cup sites
212a section
214 red micro-cup sites
216 green micro-cup sites
218 blue micro-cup sites
220 postprocessing step
230 red micro-beads
232 green micro-beads
234 blue micro-beads

The invention claimed is:

1. A method for assembling a structure on a support having a surface with a pattern of binding sites, the method comprising the steps of:

providing a first fluid on the surface of the support with the first fluid being of a type that that increases viscosity when cooled, said first fluid having first micro-components suspended therein each adapted to engage the binding sites; and cooling the first fluid proximate to selected binding sites to increase the viscosity of the first fluid proximate to the selected binding sites so that the first micro-components suspended in the first fluid are inhibited from engaging the selected binding sites.

2. The method of claim 1, further comprising the step of removing the first fluid and any non-engaged micro-components from the surface after micro-components suspended in the first fluid have engaged binding sites other than the selected binding sites.

3. The method of claim 2, further comprising the step of applying a second fluid on the surface of the support after the first fluid is removed, said second fluid having second micro-components suspended therein each adapted to engage the binding sites so that the second micro-components engage at least one of the selected binding sites.

4. The method of claim 3, wherein the step of applying a second fluid on the surface of the support further comprises the step of applying a second fluid that increases viscosity when cooled said second fluid having said second micro-components therein, and cooling the second fluid proximate to less than all of the selected binding sites to inhibit the second micro-components from engaging all of the selected binding sites.

5. The method of claim 1, wherein the step of cooling the first fluid proximate to at least one of the binding sites comprises applying a pattern of one or more cooling materials to the support proximate to said binding sites.

6. The method of claim 1, wherein the step of cooling the first fluid proximate to selected binding sites comprises directing a cooling material onto the support proximate to the selected binding sites.

7. The method of claim 1, wherein the support has at least two different types of binding sites each adapted to engage a corresponding type of micro-component and wherein the first fluid contains more than one type of first micro-components.

8. The method of claim 1, wherein the first fluid contains more than one type of first micro-components, and at least some of the binding sites are adapted to use at least one of shape recognition, hydrophobic force recognition, electrostatic recognition, molecular recognition, or biological recognition to selectively engage one type of micro-components in the first fluid.

9. The method of claim 1, wherein the first fluid comprises at least in part a polymer, a polysaccharide, a peptide gum, a cellulosic material, or a combination thereof, a poly(ethylene oxide), poly(propylene oxide), poloxamer, morpholine ethyleneoxide methacrylate, polyethyleneglycol(meth)acrylate, a polyacrylamide, polyethylene glycol, an alkylene oxide-containing polymer, copolymers thereof, or a combination thereof, a xyloglucan, a glycan gum, or a combination thereof, a cellulose ether, a methylcellulose-polyethylene glycol-citric acid ternary system, a thermal gel with a gel transition temperature that is determined by a concentration and a type of a poloxamer component thereof a poly(ethylene oxide) and poly(propylene oxide) copolymer surfactant.

10. The method of claim 1, wherein the step of cooling the first fluid comprises cooling the first fluid to form a localized increase in the viscosity of the first fluid proximate to only a portion of at least one of the binding sites.

11. The method of claim 1, wherein energy is removed from the support and the support generates removes energy in response thereto, and the step of cooling the first fluid comprises applying energy to the support proximate to the selected binding sites so that the support absorbs heat to increase the viscosity the first fluid proximate to the selected binding sites.

12. The method of claim 1, wherein the first micro-components comprise at least one of an integrated circuit on silicon, LEDs, light emitting materials, capsules, biological cells, biological structures, colored materials, color filter materials, reflective materials, conductive materials, magnetic materials, pharmaceutical compounds disks, and buckey balls.

13. The method of claim 1, wherein the step of cooling the first fluid proximate to selected binding sites comprises providing a patterned of chilled surfaces to the support, said pattern causing selected portions of the support proximate to selected binding sites to absorb heat so that the first fluid increases viscosity in areas proximate to selected ones of the binding sites.

* * * * *